(12) United States Patent
Bell et al.

(10) Patent No.: US 6,451,383 B2
(45) Date of Patent: Sep. 17, 2002

(54) POLYMER-COATED METAL COMPOSITES BY DIP AUTOPOLYMERIZATION

(75) Inventors: James P. Bell, Mansfield; Nicole Baker, Willington, both of CT (US)

(73) Assignee: The University of Connecticut, Storrs, CT (US)

( * ) Notice: Subject to any disclaimer, the term of this patent is extended or adjusted under 35 U.S.C. 154(b) by 0 days.

(21) Appl. No.: 09/894,794

(22) Filed: Jun. 29, 2001

Related U.S. Application Data

(62) Division of application No. 09/251,041, filed on Feb. 18, 1999, now Pat. No. 6,355,354, which is a continuation-in-part of application No. 09/092,212, filed on Jun. 5, 1998, which is a division of application No. 08/692,515, filed on Aug. 6, 1996, now Pat. No. 5,807,612.

(51) Int. Cl.$^7$ ................................................. B05D 3/02
(52) U.S. Cl. ........................ 427/388.1; 427/385.5; 427/435
(58) Field of Search ..................... 427/430.1, 435, 427/443.1, 385.5, 388.1, 388.2, 388.4, 388.5, 421, 428, 429

(56) References Cited

U.S. PATENT DOCUMENTS

| | | | |
|---|---|---|---|
| 3,397,007 A | | 8/1968 | Boller |
| 3,397,077 A | * | 8/1968 | Boller et al. ............... 148/6.15 |
| 3,592,699 A | | 7/1971 | Steinbrecher et al. |
| 3,709,743 A | * | 1/1973 | Dalton et al. ............... 427/309 |
| 3,865,617 A | | 2/1975 | Shimizu et al. |
| 4,366,195 A | | 12/1982 | Hall |

(List continued on next page.)

FOREIGN PATENT DOCUMENTS

| | | |
|---|---|---|
| DE | 2239409 | 3/1973 |
| DE | 2623896 | 12/1976 |
| EP | 0 012 134 A1 | 6/1980 |
| EP | 0 132 828 A2 | 2/1985 |
| FR | 2297092 | 9/1974 |
| FR | 2283936 | 4/1976 |
| GB | 1 044 976 A | 10/1966 |
| WO | WO 98/05436 | 2/1998 |
| WO | WO 00/48750 | 8/2000 |

*Primary Examiner*—Shrive P. Beck
*Assistant Examiner*—Rebecca Blanton
(74) *Attorney, Agent, or Firm*—Cantor Colburn LLP

(57) ABSTRACT

A composition and method is described for providing conformal protective or decorative polymer coatings on metals such as aluminum, copper, iron, steel, zinc, and their formation by dip autopolymerization. In accordance with the present invention, an acidic solution of organic monomer undergoes autopolymerization upon contact with a metal substrate, thereby forming a polymeric coating on the substrate. The method comprises providing the acidic monomer solution, dipping the metal substrate to be coated for a prescribed period of time depending on the thickness of the coating desired, and then removing the substrate from the solution. Importantly, the polymerization requires no application of external driving force, such as thermal or electrical energy. The coatings thus formed are up to 50 microns thick, and conform to the shape of the substrate. These coatings further have uniform thickness, and excellent thermal stability and protective properties. In one preferred embodiment of the present invention, the composition comprises an acidic solution of an organic electron acceptor monomer that undergoes autopolymerization in contact with a metal substrate, thereby forming a polymeric coating on the substrate. In another preferred embodiment of the present invention, the composition comprises an acidic solution of an organic electron acceptor monomer and an organic electron donor monomer that undergo autopolymerization in contact with a metal substrate, thereby forming a polymeric coating on the substrate. Metal-polymer composites are also described.

76 Claims, 10 Drawing Sheets

U.S. PATENT DOCUMENTS

| | | |
|---|---|---|
| 4,373,050 A | 2/1983 | Steinbrecher et al. |
| 4,455,331 A * | 6/1984 | Barsotti ..................... 427/386 |
| 5,004,646 A | 4/1991 | Benham et al. |
| 5,061,523 A | 10/1991 | Shachat |
| 5,232,560 A | 8/1993 | Bell et al. |
| 5,238,542 A | 8/1993 | Bell et al. |
| 5,290,602 A * | 3/1994 | Argyropoulos et al. ..... 427/421 |
| 5,466,357 A | 11/1995 | Bell et al. |
| 5,514,522 A * | 5/1996 | Fitzgerald et al. ....... 430/284.1 |
| 5,728,431 A * | 3/1998 | Bergbreiter et al. ..... 427/388.1 |
| 5,750,252 A | 5/1998 | Danner et al. |
| 5,807,612 A | 9/1998 | Bell et al. |
| 5,817,376 A | 10/1998 | Everaerts et al. |

\* cited by examiner

Corrosion Testing

Unexposed sample

Uncoated     Coated

Sample exposed for 1500 hours

Corrosion     No Corrosion

Sample exposed for 3000 hours

Corrosion     No Corrosion

POLYMER-COATED METAL COMPOSITES BY DIP AUTOPOLYMERIZATION

CROSS-REFERENCE TO RELATED APPLICATION

This application is a divisional of U.S. application Ser. No. 09/251,041, filed on Feb. 18, 1999, now U.S. Pat. No. 6,355,354, which is a a is a continuation-in-part of U.S. application Ser. No. 09/092,212, filed on Jun. 5, 1998, which is a divisional of U.S. application Ser. No. 08/692,515, filed on Aug. 6, 1996, now U.S. Pat. No. 5,807,612. The above mentioned applications and patents are herein incorporated by reference in their entirety.

BACKGROUND OF THE INVENTION

1. Field of the Invention

This invention relates to compositions and methods for coating metal substrates. In particular, this invention relates to compositions and methods for forming a polymeric coating on a metal surface by dip autopolymerization. Importantly, the polymerization requires no application of external driving force, such as thermal or electrical energy. The coatings thus formed are uniform, conformal and pinhole-free. The method is suitable for forming coatings with a variety of desirable properties, such as corrosion and erosion resistance, abrasion resistance, and electrical and thermal insulation.

2. Brief Description of the Prior Art

Surface treatment, i.e., coating, of metals plays an important role in metal applications. Such coating processes may be applied for protective or decorative purposes. Conventional coating processes include, for example, spray painting, electrodeposition, electrophoresis, powder coating, anodization, and chromate conversion coatings. Metals ordinarily treated by these methods include iron, aluminum, copper, and their alloys. Each of these process technologies is currently used extensively in the metal finishing industry, and each has certain advantages and disadvantages.

For example, U.S. Pat. Nos. 5,232,560 and 5,466,357 to Bell et al. describe a method for electropolymerization in a substantially aqueous solution to form copolymer coatings onto electrically conductive substrates. Similarly, as described in U.S. Pat. No. 5,238,542 to Bell et al., cyclic N-substituted methacrylamide monomers may be electropolymerized onto electrically conductive filler. Electropolymerization is advantageous in that it allows the deposition of thick, thermally stable coatings. But while suitable for their intended purposes, electropolymerization requires the application of electrical energy as a driving force.

The practice of the other above-mentioned methods can be expensive, and result in undesirable waste products that must be subsequently disposed of. Spray painting may require a separate prepolymerization step prior to application of the coating. Electrodeposition and anodization require specialized equipment and thus capital investment. Many technologies require the input of heat or thermal energy as a driving force for the deposition processes. For these reasons, industry is in constant search of less expensive technologies to improve competitiveness in the world marketplace. In addition, increasing environmental concerns call for cleaner technologies to meet government regulations and reduce waste treatment and disposal cost.

In particular, aluminum is the most widely used metal today by volume. Areas of application for aluminum range from aerospace to marine to architectural. In almost all cases where aluminum is used, a surface treatment and finishing process are applied. The two most common surface treatments for aluminum are anodization and conversion coating. Anodization is an energy-intensive process, using phosphates. Conversion coating uses chromate and other heavy metal ions. Both of these treatments thus generate environmentally hazardous waste, which must be properly disposed of. Accordingly, there remains a need for efficient, inexpensive compositions and coating methods for aluminum and other metals that generate minimal waste.

SUMMARY OF THE INVENTION

The above-discussed and other problems and deficiencies of the prior art are overcome or alleviated by the composition and method of the present invention for coating metals by dip autopolymerization, wherein organic monomer in an acidic solution undergoes autopolymerization upon contact with a metal substrate at room temperature, thereby forming a polymeric coating on the metal substrate. Importantly, the polymerization requires no application of external driving force, such as thermal or electrical energy. The coatings thus formed may be up to 50 or more microns thick, and have molecular weights up to about 250,000 or more.

In one preferred embodiment of the present invention, the composition comprises an acidic solution of an organic electron acceptor monomer that undergoes autopolymerization in contact with a metal substrate, thereby forming a polymeric coating on the substrate. In another preferred embodiment of the present invention, the composition comprises an acidic solution of an organic electron acceptor monomer and an organic electron donor monomer that undergo autopolymerization in contact with a metal substrate, thereby forming a polymeric coating on the substrate. By electron acceptor monomer it is meant a monomer or small polymer having at least one electron withdrawing group, capable of further polymerization with the electron donor monomer. By electron donor monomer it is meant a monomer or small polymer having at least one electron donating group, capable of further polymerization with an electron acceptor monomer. Other metals suitable for use in the practice of the present invention include copper, iron, and zinc.

In another embodiment of the present invention, there is described metal-polymer composites comprising a metal such as copper, aluminum, iron, zinc, steel, or alloys thereof, and a polymeric coating.

In accordance with a method of the present invention, an acidic monomer solution is provided, and a clean metal substrate is submerged (dipped) into the monomer solution for a prescribed period of time. Polymerization occurs on the metal surface in the monomer solution spontaneously without application of any external driving force, such as thermal or electrical energy. Rather, polymerization is initiated at the metal-solution interface due to the interaction of the metal surface with the monomer in solution. The monomer converts directly to a polymer coating on the metal surface and thus obviates the need for the prepolymerization step required in conventional coating methods.

In another preferred embodiment of the present invention, an acidic monomer solution is applied onto a metal substrate by spraying, painting, roll coating, rod coating, blade coating, wire bar coating, extrusion coating, air knife coating, curtain coating, slide coating, doctor coating, gravure coating and the like. Polymerization occurs without application of external driving force, and converts directly to a polymer coating on the metal surface. The acidic monomer solution optionally comprises a viscosity modifier, usually a thickening agent, which facilitates application and which is optionally subsequently removed from the formed coating.

The present invention results in the formation of a uniform, conformal and pinhole free polymeric organic coating on metal surfaces. Physical and chemical properties such as corrosion and erosion resistance, electrical or thermal insulation, adhesion, printability, and scratch resistance of the coating may be varied simply by varying the composition of the monomer solution. The polymer coating formed may also be used as a primer for further surface finishing treatments or as a final coating.

The process can be very easily applied in various industrial settings. Relative to other polymerization techniques, the method is robust, being insensitive to moisture and other impurities. No special metal treatment is required other than cleaning of the metal surface. In the practice of the method, the low cost of operation relative to other coating processes will result in considerable energy savings. Sophisticated equipment is not required, so capital equipment cost is also minimal. Solvent use is minimal, and no heavy metals are required to be present. Also, water is frequently used as a co-solvent with a suitable solvent to dissolve the monomer, resulting in a more environmentally acceptable coating composition and method.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
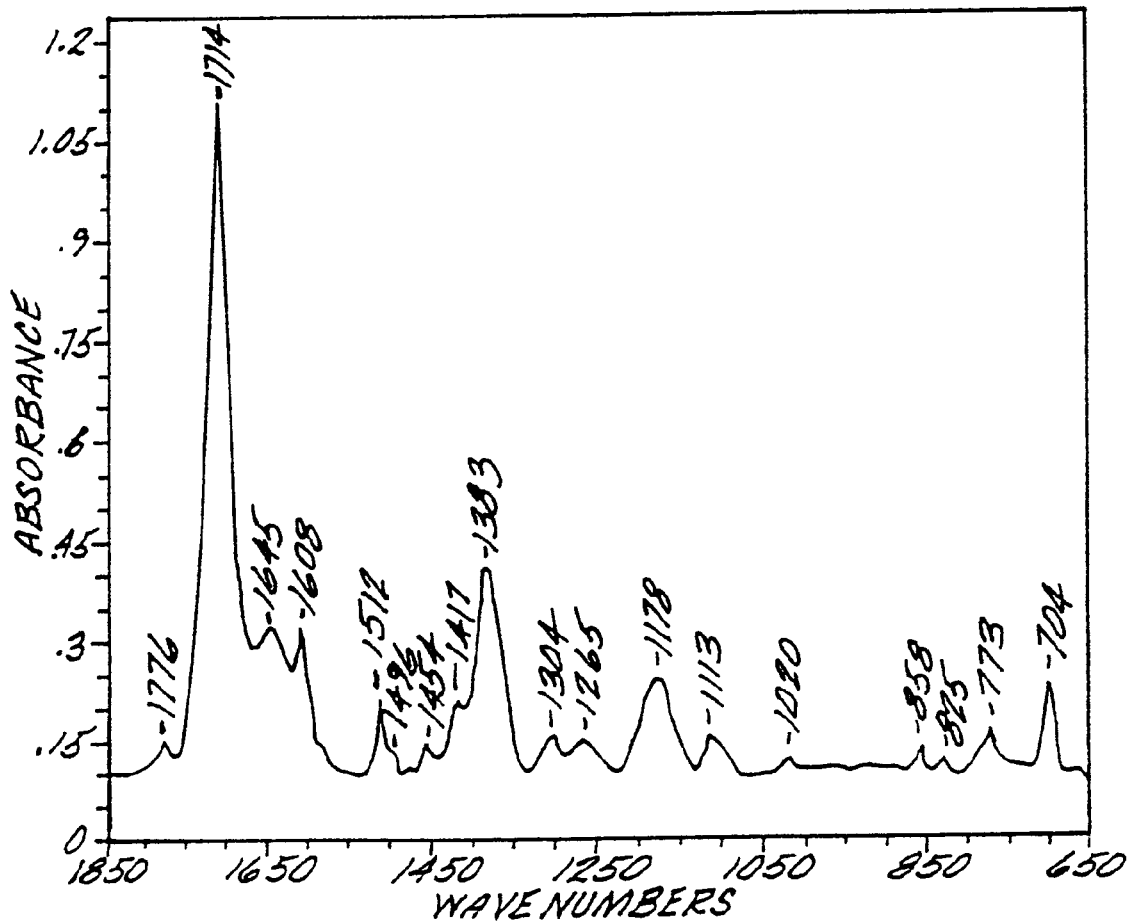
FIG. 1 is a transmission IR spectrum of a typical poly(4-CPMI/styrene) coating on steel obtained according to the method of the present invention.

The present invention is directed to a composition and method for producing polymeric coatings on clean metal substrates, wherein organic monomers in an acidic solution undergo autopolymerization upon contact with a metal substrate at room temperature, thereby forming a polymeric coating on the metal substrate. The coating solution and method is environmentally benign. The method is particularly advantageous in that it requires no external application of thermal or electrical energy.

In accordance with one embodiment of the method, the metal substrate is dipped into one of the below-described compositions. In another embodiment, the substrate metal is painted or sprayed with one or more of the below-described compositions. The painting or spraying application process is particularly useful for substrates that do not lend themselves to the dipping method, for example, large volume applications such as aircraft, boats, and the like. The compositions of this embodiment preferably further comprise a viscosity-modifying agent and/or an adhesion promoter. The viscosity-modifying agent is usually a thickening agent which increases the viscosity of the composition, thus facilitating application of the solution by methods such as spraying, painting, roll coating, rod coating, blade coating, wire bar coating, extrusion coating, air knife coating, curtain coating, slide coating, doctor coating, gravure coating and the like, and preventing the solution from running off the substrate. Preferably, the thickening agent is sufficiently hydrophilic to enable its removal from the formed polymer-coated metal composite by rinsing with water or a water-solvent rinse. Thickening agents suitable for use in the present invention include, but are not limited to, poly (vinylpyrrolidone), poly(ethylene oxide), poly(acrylic acids) and derivatives thereof, ethylene-maleic anhydride copolymers, vegetable gums, such as guar gum, sodium alginate, and gum tragacanth, cellulose-based compounds, such as cellulose, methyl cellulose, carboxymethylcellulose, and sodium carboxymethyl cellulose, and ethylene-vinyl ether copolymer.

Preferably, an adhesion promoter is also added to the compositions wherein the application is by spraying, painting, roll coating, rod coating, blade coating, wire bar coating, extrusion coating, air knife coating, curtain coating, slide coating, doctor coating, gravure coating and the like. The adhesion promoter may be selected from those known in the art that function at or near room temperature. Preferably, the adhesion promoter is a silane monomer such as vinyltrimethoxysilane, vinyltriethoxysilane, vinyltris(β-methoxyethoxy)silane, γ-methacryloxypropyltimethoxysilane, vinyltrichlorosilane, vinyltris(β-methoxy)silane, N-β-(N-vinylbenzylaminoethyl)-γ-aminopropyltrimethoxysilane, vinyltriacetoxysilane, and γ-methacryloxypropylmethyldimethoxysilane. A particularly preferred adhesion promoter is the silane monomer 3-(methoxysilyl) propyl methacrylate. The adhesion promoter may be used alone or in a combination of a plurality of the adhesion promoters. Most preferably, the compositions of this embodiment comprise both a thickening agent and an adhesion promoter.

The composition of the present invention comprises an acidic starting solution of organic monomer, capable of undergoing autopolymerization upon contact with a metal substrate, thereby forming a polymeric coating on the metal substrate. As used herein, and as is shown in the accompanying Examples 1–6, "autopolymerization" refers to a polymerization process whereby polymerization of monomers occurs upon exposure of the monomer solution to the metal substrate in the absence of other catalyst or catalysts. Water may be used as a co-solvent with a suitable solvent to dissolve the monomers, resulting in a more environmentally acceptable coating composition and method. Polymerization ordinarily proceeds at room temperature. However, heat may be applied to the solution in order to increase the rate of polymerization, or to effect a variation in the properties of the final coating.

Although the preferred embodiments of the present invention contemplate at least a two-component monomer solution, a one-component monomer solution is also with the scope of the present invention. A particularly preferred one-component monomer solution comprises N-phenylmaleimide as the monomer undergoing autopolymerization. Furthermore, the term "monomer" as used herein is intended to comprise both monomers and small polymers, e.g., small molecules with one or more repeating units. Such polymers must be soluble in the solvents suitable for use with the present invention, and capable of undergoing autopolymerization upon exposure to a metal substrate.

In one preferred embodiment of the present invention, the composition comprises an acidic starting solution of organic electron acceptor monomer that undergoes autopolymerization in contact with a metal substrate, thereby forming a polymeric coating on the substrate. Thus, one particularly preferred embodiment of the present invention comprises an acidic starting solution of methyl methacrylate (MMA) and 4-carboxyphenyl maleimide (4-CPMI). Introduction of a steel substrate into this solution induces autopolymerization of the MMA and 4-CPMI, thereby forming a poly(MMA/4-CPMI) coating onto the steel. Polymeric coatings thus formed may be up to about 50 microns or more thick. They are even, conformal, and pinhole-free. Other particularly preferred embodiments of this type comprise an acidic starting solution of 4-CPMI and acrylonitrile (AN). Preferably, these monomer solutions are used to coat steel, although other metals might also be used. Without being bound by theory, it is hypothesized that when used to coat steel, polymerization is initiated by a redox process on the surface of the steel substrate. It is unlikely that the process is Lewis-acid catalyzed, as the addition of $Fe^{+3}$ to the acidic monomer solution failed to induce polymerization.

Another preferred embodiment of the present invention comprises an acidic starting solution of an electron acceptor monomer and an electron donor monomer. By electron acceptor monomer it is meant a monomer or small polymer having at least one electron withdrawing group, capable of further polymerization with the electron donor monomer. By electron donor monomer it is meant a monomer or small polymer having at least one electron donating group, capable of polymerization with an electron acceptor monomer. The molar ratio of the electron donor monomer to the electron acceptor monomer will generally range from about 5:95 to about 95:5. The preferred concentration of electron donor monomer in solution is generally between about 0.01–5 moles per mole of electron acceptor monomer, and preferably about 0.05–1 moles of electron donor monomer per mole of electron acceptor monomer.

Typical electron withdrawing groups for electron acceptor monomers include, but are not limited to, carbonyl, carboxyl, carboxylate, carboxamide, nitrile groups and the like. Thio analogues of the oxygen-containing functional groups are also effective groups for electron acceptor monomers.

Illustrative electron acceptor monomers include, but are not limited to, acrylic acid, acrylamide, acrylonitrile, and alkyl acrylates in which the alkyl moiety contains 1 to 40 carbon atoms. Preferably, the alkyl moieties have 1 to 22 carbon atoms, including methyl acrylate, ethyl acrylate, propyl acrylate, isopropyl acrylate, butyl acrylate, isobutyl acrylate, sec-butyl acrylate, hexyl acrylate, 2-ethylhexyl acrylate, heptyl acrylate, octyl acrylate, isooctyl acrylate, nonyl acrylate, decyl acrylate, undecyl acrylate, dodecyl acrylate, tridecyl acrylate, pentadecyl acrylate, hexadecyl acrylate, octadecyl acrylate and the like.

Other electron acceptor monomers include but are not limited to aryl and aralkyl acrylates such as phenyl acrylate and p-tolyl acrylate, cycloalkyl acrylates such as cyclohexyl acrylate, methacrylic acid, methacrylamide, methacrylonitrile, and alkyl methacrylates in which the alkyl moiety contains 1–40 carbon atoms. Preferably, the alkyl moieties contain 1 to 22 carbon atoms, including methyl methacrylate, ethyl methacrylate, propyl methacrylate, isopropyl methacrylate, butyl methacrylate, isobutyl methacrylate, sec-butyl methacrylate, amyl methacrylate, hexyl methacrylate, heptyl methacrylate, octyl methacrylate, 2-ethylhexyl methacrylate, nonyl methacrylate, decyl methacrylate, undecyl methacrylate, dodecyl methacrylate, tridecyl methacrylate, pentadecyl methacrylate, hexadecyl methacrylate, octadecyl methacrylate, and the like.

Other electron acceptor monomers contemplated for use with the present invention include, but are not limited to, aralkyl methacrylates such as benzyl methacrylate, aryl methacrylates such as phenyl methacrylate and p-tolyl methacrylate and cycloalkyl methacrylates such as cyclohexyl methacrylate, as well as various ketones, such as methyl vinyl ketone, ethyl vinyl ketone, methyl isopropenyl ketone, acrolein, methacrolein and the like.

Sulphur-containing compounds which are effective electron acceptor monomers include thiocarboxylic acids such as thioacrylic acid and thiomethacrylic acid, thiocarboxamides such as thioacrylamide and thiomethacrylamide, as well as alkyl, aryl, aralkyl and cycloalkyl thiocarboxylates such as methyl thioacrylate, methyl thiomethacrylate, phenyl thioacrylate, benzyl thiomethacrylate, cyclohexyl thiomethacrylate and the like. Dithioacrylic acid, dithiomethacrylic acid and the esters of these dithiocarboxylic acids are also useful electron acceptor monomers.

Electron donor monomers are typically acyclic and cyclic monoolefins and conjugated dienes. The monoolefins may be alpha-olefins or internal olefins, including cycloolefins, and may be unsubstituted or may contain alkyl, aryl or aralkyl substituents. The effective alpha-olefins include, but are not limited to, 1-alkenes such as ethylene, propylene, 1-butene, 1-pentene, 1-hexene, 1-heptene, 1-octene, 1-nonene, 1-decene, 1-undecene, 1-dodecene, 1-tridecene, 1-tetradecene and other 1-alkenes containing up to 40 carbon atoms.

1-Alkenes having substituents further removed from the double bond are also effective, including, but not being limited to, 3-methyl-1-pentene, 4-methyl-1-pentene, 3-methyl-1-hexene, 5-methyl-1-hexene and the like.

Aromatic substituted alpha-olefins are particularly effective electron donor monomers and include styrene, alpha-methylstyrene, p-methylstyrene, o-methylstyrene, m-methylstyrene, p-ethylstyrene, p-propylstyrene, p-isopropylstyrene, p-butylstyrene, p-nonylstyrene, p-chlorostyrene, and other 1-alkenes containing alkyl substituted aromatic moieties. Similarly, alpha-olefins containing aromatic substituents further removed from the double bond such as 3-phenyl-1-butene, 4-p-methylphenyl-1-pentene and the like are effective electron donor monomers.

Internal olefins which are useful electron donor monomers in the present invention may be unsubstituted alkyl or aryl substituted acyclic or cyclic monoolefins, including 2-butene, 2-pentene, 3-hexene, 2-heptene, 3-heptene, 2-octene, 3-octene, 4-octene, 2-nonene, 3-nonene, 4-nonene, 2-methyl-2-butene, 2-methyl-2-pentene, 4-methyl-2-pentene, 2-methyl-2-hexene, 4-methyl-2-hexene, 5-methyl-2-hexene, 2,5-dimethyl-3-hexene, 1-phenyl-3-pentene, cyclopentene, cycloheptene, cyclooctene, cyclononene, cyclodecene, cycloundecene, cyclododecene, 1-methylcycloheptene, 5-methylcycloheptene and the like.

Illustrative conjugated dienes useful as electron donor monomers according to this invention include butadiene, isoprene, 2-chloro-1,3-butadiene, 2,3-dichloro-1,3-butadiene, 2,3-dimethylbutadiene, propylene, 2,4-hexadiene, 2-methyl-1,3-pentadiene, 2-ethyl-1,3-butadiene, 2-propyl-1,3-butadiene, 2-phenyl-1,3-butadiene, 3-methyl-1,3-pentadiene, 2-ethyl-1,3-pentadiene, 2-methyl-1,3-hexadiene and the like. Cyclic conjugated dienes such as 1,3-cyclohexadiene, 1,3-cycloheptadiene, 1,3-cyclooctadiene, 1,3-cyclononadiene and the like are also effective electron donor monomers.

Preferred electron acceptor monomers are 4-carboxyphenyl maleimide (4-CPMI), N-phenyl maleimide (NPMI), bis-maleimide (BMI), and 2-(methacryloyloxy) ethyl acetoacetate (MEA), and acrylonitrile (AN). A preferred electron donor monomer is styrene.

A particularly preferred embodiment of the electron donor/electron acceptor monomer solution comprises styrene and N-phenyl maleimide. Without being bound by theory, it is hypothesized that in this system, the driving force for autopolymerization in the electron donor/electron acceptor systems on aluminum substrates is derived from the metal surface where Lewis acids such as $Al^{3+}$ are generated when immersed in an acidic solution. The $Al^{3+}$ ion is classified as a hard Lewis acid and therefore has a strong affinity for an electron pair. Lewis acids may increase the electrophilicity of the electron-poor monomer by complexing to its lone pair of electrons. This in turn increases the electron disparity between the reaction partners. It is proposed here that these transition metal Lewis acids interact with an electron acceptor monomer such as NPMI, thereby increasing the electrophilicity of the monomer and resulting in the spontaneous formation of an NPMI-styrene tetramethylene diradical. The polymerization may then proceed by alternate addition of the electron donor monomer, e.g., styrene, and the electron acceptor monomer, e.g., NPMI, to the growing radical. This kind of alternating addition of monomers is also known as cross-propagation.

Where two monomers are present in the monomer solution, the polymer formed therefrom may be an essentially alternating copolymer, that is, a copolymer in which the comonomer units are present in essentially equimolar quantities and are situated alternately along the copolymer chain. However, random polymers may also be formed by the autopolymerization method of the present invention. Furthermore, a third and even a fourth monomer (or more) may be introduced into the monomer solution. Variation in the number of monomers, the monomer ratios, and their composition allows for variation in the final properties of the formed coating. Other process parameters that may be used to affect the final properties of the coatings include monomer concentration, metal surface pretreatment, polymerization time, and drying temperature.

A single solvent may be used to dissolve the monomers, or a mixture of several hydrocarbon, halogenated, aromatic, or oxygen donating solvents. Appropriate solvents include, but are not limited to, benzene, toluene, chloroform, methylene chloride, hexane, acetone, tetrahydrofuran, acetonitrile, dimethyl formamide, dimethylacetarnide, N-methyl-2-pyrrolidone, and dimethyl sulfoxide. In many instances, water may be used as a co-solvent, especially where other polar solvents, such as acetone, tetrahydrofuran, acetonitrile, dimethyl formamide, dimethylacetamide, N-methyl-2-pyrrolidone, diglyme, cyclohexyl-2-pyrrolidone, pyridine, or dimethyl sulfoxide are used. Such aqueous systems are preferable because the process cost is lowered. Where polymerization proceeds via a free radical mechanism, aqueous systems would favor such a mechanism, thus allowing high molecular weight polymer coatings to be easily obtained.

The solvent or solvent mixture used in the method of the present invention must be compatible with the monomer(s) used. The solvent or solvent mixture should have reasonable solubility for the monomer(s) used in the process, i.e, able to dissolve each monomer to a concentration of about 0.01–5 molar, and preferably to a concentration of about 0.1–1 molar. Alternatively, the monomers may be present in solution as an aqueous emulsion. However, such solvent or solvent mixture preferably has significantly lower solubility for the formed polymer, as the polymer should be insoluble to prevent it from dissolving into the solution. Using the proper solvent or solvent mixture thus allows the formation of a uniform coating on the metal substrate.

Importantly, the pH of the monomer solution must be acidic, having a pH of preferably less than about 6.5. The optimal pH value is within the range of about 1 to about 6.5, and preferably from about 2.5 to about 5.5. Solutions having an essentially neutral pH failed to undergo autopolymerization, even in the presence of a metal substrate. When the monomer solution is itself acidic as prepared, pH adjustment may be unnecessary. Otherwise, the pH may be adjusted using acids such as dilute sulfuric acid, hydrochloric acid, dilute nitric acid, acetic acid, phosphoric acid, and citric acid.

While not required, an accelerator may be added to the monomer solution to increase the reaction rate. Preferably, the accelerator is a metal salt. The salt most likely interacts with the electron acceptor monomer to increase its reactivity. Possible salts may include, but are not limited to, halides of aluminum, zinc, nickel, magnesium, cerium, tin, zirconium, chromium, vanadium, titanium and molybdenum, and boron trifluoride, ethyl aluminum dichloride or ethyl aluminum sesquichloride. The amount of accelerator used may vary over a wide range. However, the preferred concentration is generally between about 0.01–5 mole of accelerator per mole of electron acceptor monomer, and most preferably, about 0.05–1 mole of accelerator per mole of electron acceptor monomer.

Metal substrates which may be coated by the method of the present invention include a number of economically important metals, including, but not limited to, aluminum, iron, copper, steel, zinc, and alloys thereof. Other metals may be possible, for example, other transition metals and their alloys, such as chromium, tin, indium, nickel, cobalt, and titanium and their alloys. Metals such as magnesium, or inert substances such as silica or glass are not coated by the autopolymerization method of the present invention.

In accordance with one method of the present invention, the above-described acidic monomer starting solution is provided and a clean metal substrate is submerged (dipped) into the monomer solution for a prescribed period of time. Polymerization occurs on the metal surface in the monomer solution spontaneously without application of any external driving force, such as thermal or electrical energy. Rather, polymerization is apparently initiated at the metal-solution interface due to the interaction of the metal surface with the monomers in solution, converting the monomers directly to polymer coatings on the metal surface and obviating the prepolymerization step in the conventional coating methods.

In accordance with another method of the present invention, the above-described acidic monomer solution is painted or sprayed onto the metal substrate, or applied by rod coating, roll coating, and the like. In this embodiment, the above-described monomer solution preferably additionally comprises a viscosity-modifying agent and/or an adhesion promoter, more preferably both.

The viscosity-modifying agent is preferably a thickening agent which increases the viscosity of the composition, thus facilitating application of the solution by methods such as roll coating, rod coating, painting and spraying, and preventing the solution from running off the substrate. Preferably, the thickening agent is sufficiently hydrophilic to enable its removal from the formed polymer-coated metal composite by rinsing with water or a water-solvent rinse. Thickening agents suitable for use in the present invention include, but are not limited to, poly(vinylpyrrolidone), poly(ethylene oxide), poly(acrylic acids) and derivatives thereof, ethylene-maleic anhydride copolymers, vegetable gums, such as guar gum, sodium alginate, and gum tragacanth, cellulose-based compounds, such as cellulose, methyl cellulose, carboxymethylcellulose, and sodium carboxymethyl cellulose, and ethylene-vinyl ether copolymer.

Preferably, an adhesion promoter is also added to the compositions wherein the application is by painting and spraying. The adhesion promoter may be selected from those known in the art that function at or near room temperature, for example silanes, titanates such as neopentyl(diallyl) trineodecanoyl titanate), neopentyl(diallyl)oxytri(dioctyl) phosphate titanate, and zirconates such as neopentyl(diallyl) oxytri(dioctyl) pyrophosphate zirconate, and neopentyl (diallyl)oxytri(N-ethylenediamine)ethyl zirconate. Preferably, the adhesion promoter is a silane such as vinyltrimethoxysilane, vinyltriethoxysilane, phenyl trimethoxy silane, phenyl triethoxysilane, vinyltris(β-methoxyethoxy)silane, γ-methacryloxypropyltrimethoxysilane, vinyltrichlorosilane, vinyltris(β-methoxy)silane, N-β-(N-vinylbenzylaminoethyl)-γ-aminopropyltrimethoxysilane, vinyltriacetoxysilane, and γ-methacryloxypropylmethyldimethoxysilane, and mixtures thereof. A particularly preferred adhesion promoter is 3-(methoxysilyl) propyl methacrylate. The adhesion promoter may be used alone or in a combination of a plurality of the adhesion promoters. Most preferably, the compositions of this embodiment comprise both a thickening agent and an adhesion promoter.

In the painting or spraying application method, the polymer coated metal composite is preferably treated after polymerization to remove the viscosity modifier. Treatment may be any treatment that removes the viscosity modifier. The preferred method is to rinse the polymer coated metal composite with a water or water-solvent rinse. Preferred solvents in the water-solvent rinse are water miscible, dissolve the viscosity modifier and excess monomer but not the formed coating. Suitable solvents include, but are not limited to, N-methyl-2-pyrrolidone, tetrahydrofuran, acetone, benzene, toluene, chloroform, methylene chloride, hexane, acetonitrile, dimethyl formamide, dimethylacetamide, dimethyl sulfoxide, acetonitrile, dimethyl formamide, dimethylacetamide, diglyme, cyclohexyl-2-pyrrolidone, pyridine, dimethyl sulfoxide, dioxane, N,N-dimethylformamide, and the like.

No special surface treatments are necessary for the autopolymerization methods. The only requirement is a clean, preferably dry, surface. Furthermore, simple cleaning processes such as detergent washing, grit blasting, and trichloroethylene degreasing are sufficient to remove dirt and organic contaminants on the metal surface.

The methods of the present invention may be used for various applications requiring coatings on metals, such as automobile bodies and parts, circuit board heat sinks, electric motor starters, air conditioner fins, and any other type of metal parts or fittings requiring an organic coating. The process can be scaled up to industrial requirements without apparent complications. Process scale-up involves simply larger solution volume formulations and use of larger polymerization tanks.

Thus, still another embodiment of the present invention is a polymer-metal composite comprising a metal substrate and a polymeric coating. In this embodiment, the metal substrate comprises aluminum, copper, steel, iron, or zinc, and alloys thereof. Preferably, the polymeric coating comprises a coating of poly(4-CPMI/styrene), poly(4-CPMI/MMA), poly(4-CPMI/AN), poly(NPMI/styrene), poly(NPMI/BMI/styrene), and poly(NPMI/BMI/MEA/styrene).

The composition and methods for autopolymerization on metals of the present invention allows polymer coatings to be synthesized directly onto the metal surface. The method may be conducted at room temperature, and no external driving force, i.e., thermal or electrical energy, is required. The key difference between this process and other conventional coating processes, such as dip coating or electrophoresis, is that here, the polymer chains "grow" at the metal surface, allowing formation of uniform coatings on objects with complex topographies. The composition and method also results in better adhesion of the metal substrate to the polymer coating, because wetting of the metal surface is easier by monomers, compared with polymers. Furthermore, it is not necessary to evaporate large quantities of solvent during the drying of the polymer coating, as is required by conventional coating methods.

The present invention is further illustrated by the following non-limiting examples.

Materials

Styrene and methyl methacrylate were obtained from Fisher Scientific Company. Inhibitor-free styrene was obtained by vacuum distillation at 40° C. Methyl methacrylate was also purified by vacuum distillation. N-Methyl-2-pyrrolidone (NMP) was used as received from Fisher Scientific Company. 4-Carboxyphenyl maleimide (4-CPMI) was prepared according to the method described by B. S. Rao, in Journal of Polymer Science: Part C: Polymer Letters, Vol. 26, p. 3 (1988). Monomer purity was confirmed by nuclear magnetic resonance (NMR) and differential scanning calorimetry (DSC). The DSC thermogram showed only one sharp melting peak at 241° C. N-phenyl maleimide (NPMI) and bis-maleimide (BMI) were purchased from Mitsui Toatsuo Chemical Co., Japan. NPMI was recrystallized from cyclohexane and BMI was used as obtained. 2-(Methacryloyloxy)ethyl acetoacetate (MEA) from Aldrich Chemical Co. was purified by passing through DHR-4 inhibitor removal columns from Scientific Polymer Products. 3-(Methoxysilyl)propyl methacrylate was purchased from Fisher Scientific Company.

Metal substrates were SAE 1010 carbon steel coupons from Q-Panel Company, and aluminum 1100, 2024, 6061, or 7071 alloy. Metal substrates in the aluminum 3000 series may also be used. The steel surface was cleaned by washing with detergent, rinsing with an ample amount of distilled water, and oven-drying at 90° C. Aluminum was cleaned by one of two methods: (i) degreasing with 5% aqueous Micro □ (an alkaline soap) solution in an ultrasonic bath for 5 min., rinsing with distilled water, treating with 5% hydrofluoric acid for 15 sec., and rinsing with distilled water; or (ii) grit blasting using 170 mesh silica, then rinsing with distilled water.

Characterization

A Nicolet 60SX Fourier transform infrared spectrometer (FT-IR) was used to characterize the composition of the polymer coating at a resolution of 4 $cm^{-1}$, by pressing KBr pellets from mixtures of about 150 mg KBr powder and 10 mg polymer. A differential scanning calorimeter (DSC) model 2920 and thermogravimetric analyzer (TGA) model 2950 from TA Instruments were used for thermal analyses, using a heating rate of 10° C./min for the DSC and 20° C./min for the TGA. The molecular weights of the polymers were obtained by GPC on a Waters 150 C gel permeation chromatograph using polystyrene standards. The measurements were conducted at 35° C. in tetrahydrofuran. Dielectric constant measurements of the coating were obtained using a Time Domain Dielectric Spectrometer (TDDS) from IMASS, Inc. Corrosion protection properties of the polymer coatings were studied by exposing samples to a 5% NaCl salt fog, following the ASTM B-117 test method.

EXAMPLE 1

Poly(4-CPMI/Styrene) on Steel

General Polymerization Procedure: A monomer solution was prepared by first dissolving the styrene and 4-CPMI in NMP on a 1:1 mole basis, then mixing with water to a final concentration of 0.2 M in each monomer. Polymerization was initiated by dipping a cleaned substrate in the solution. Simultaneous polymerization of the monomers and deposition of the formed polymers occurred at the metal surface. After a prescribed period of time, ranging from 1 minute to 1 hour, the metal substrate was withdrawn from the solution, thoroughly rinsed with distilled water, and dried in an oven at 50 to 150° C. for 1–24 hours. Further drying was carried out at 250° C. under vacuum to remove any trapped solvent.

Results and Discussion: The IR spectrum of a typical poly(4-CPMI/styrene) polymeric coating obtained by the above procedure is shown in FIG. 1. The symmetric and asymmetric C=O stretching of the carbonyl groups in the imide ring absorb at 1776 $cm^{-1}$ and 1714 $cm^{-1}$, respectively. The strong absorption at 1383 $cm^{-1}$ is due to symmetric C—N—C stretching of the imide ring. The peak at 1512 $cm^{-1}$ is attributed to the para-substituted phenyl ring in 4-CPMI, while the aromatic C—C stretching at 1608 $cm^{-1}$ has contributions from both 4-CPMI and styrene. The characteristic absorption of polystyrene at 1493 and 1452 $cm^{-1}$ is assigned as the semi-circle stretching and mixed C—H bending of a mono-substituted phenyl ring. The C—H bending of the vinyl group at 991 $cm^{-1}$ and 908 $cm^{-1}$ of styrene, and the C—C stretching of the imide ring at 949 $cm^{-1}$ of 4-CPMI are absent in the spectrum, confirming that the polymerization reaction occurred via opening of the double bond.

Figure 2:
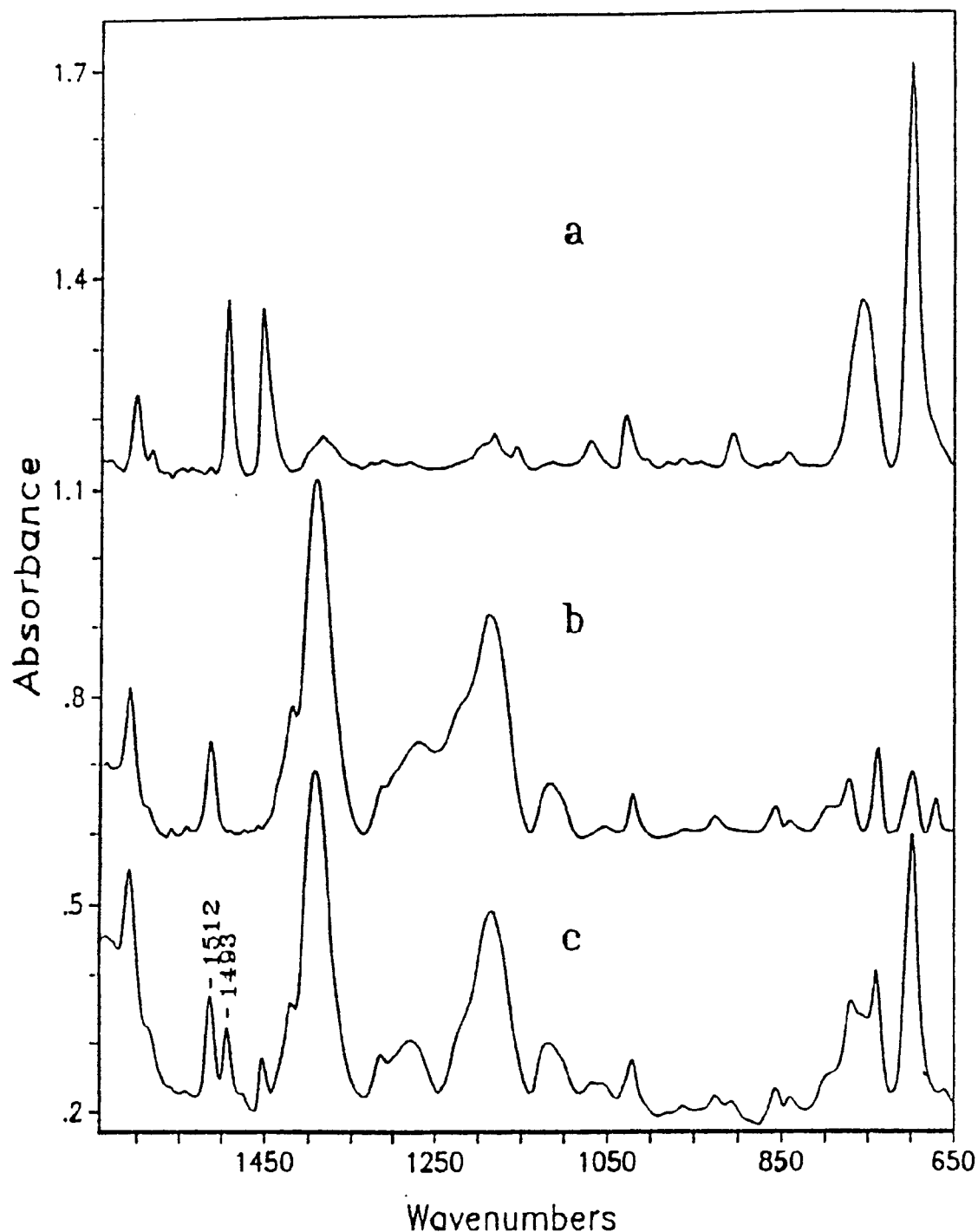
FIG. 2 is transmission IR spectra of (a) poly(4-CPMI), (b) polystyrene, and (c) a blend of the two hompolymers.

To determine the composition of the coating, a calibration was obtained using homopolymers of 4-CPMI and styrene. FIGS. 2(a) and 2(b) are transmission IR spectra of polystyrene and poly(4-CPMI), respectively, obtained by solution polymerization in THF. The spectrum of the blend of the homopolymers agrees with that of the copolymer with no additional peaks appearing, as shown in FIG. 2(c).

Figure 3:
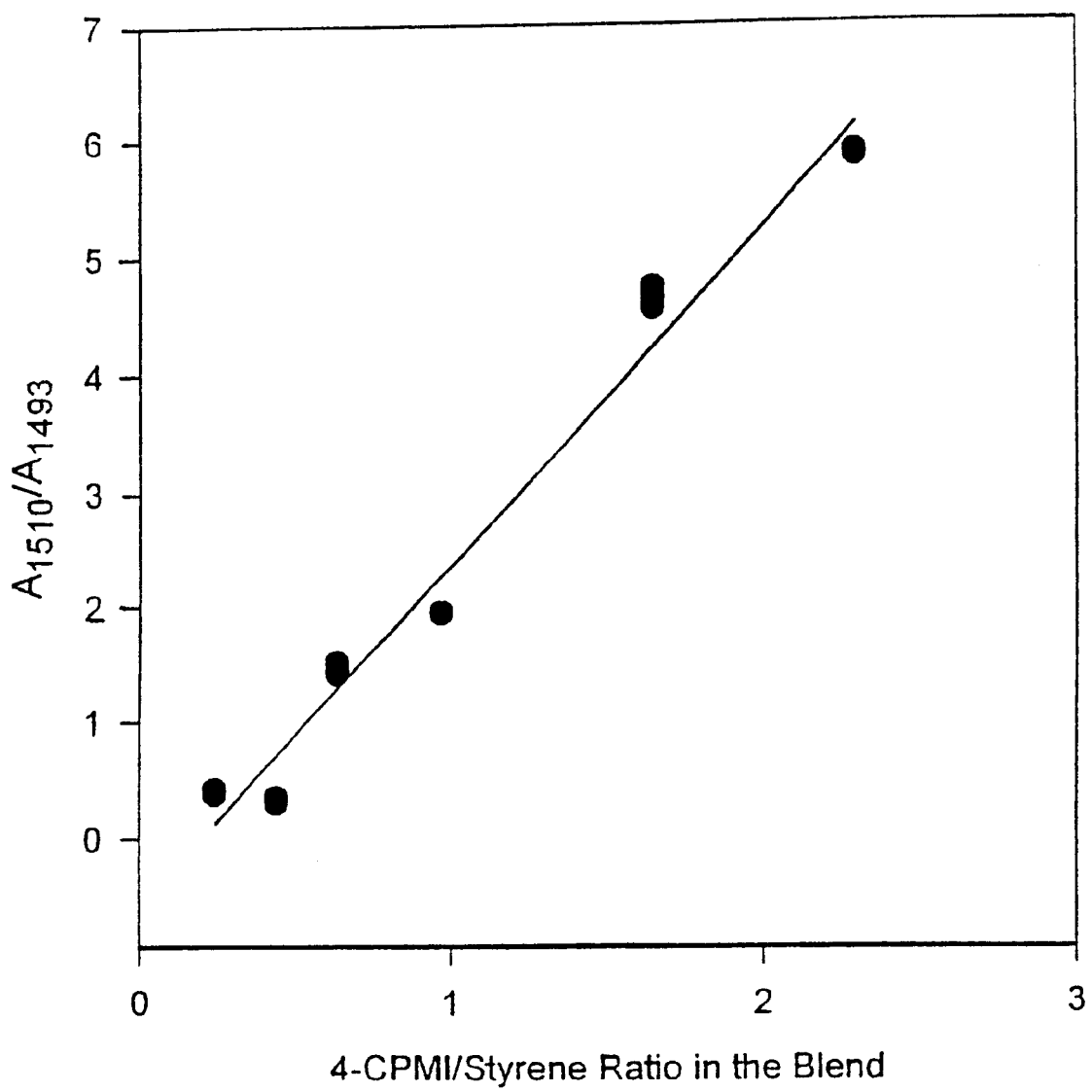
FIG. 3 is a plot showing the absorbance ratio of 1510 $cm^{-1}$ to 1493 $cm^{-1}$ vs. the ratio of 4-CPMI to styrene in a blend of polystyrene homopolymer and poly(4-CPMI)
Figure 4:
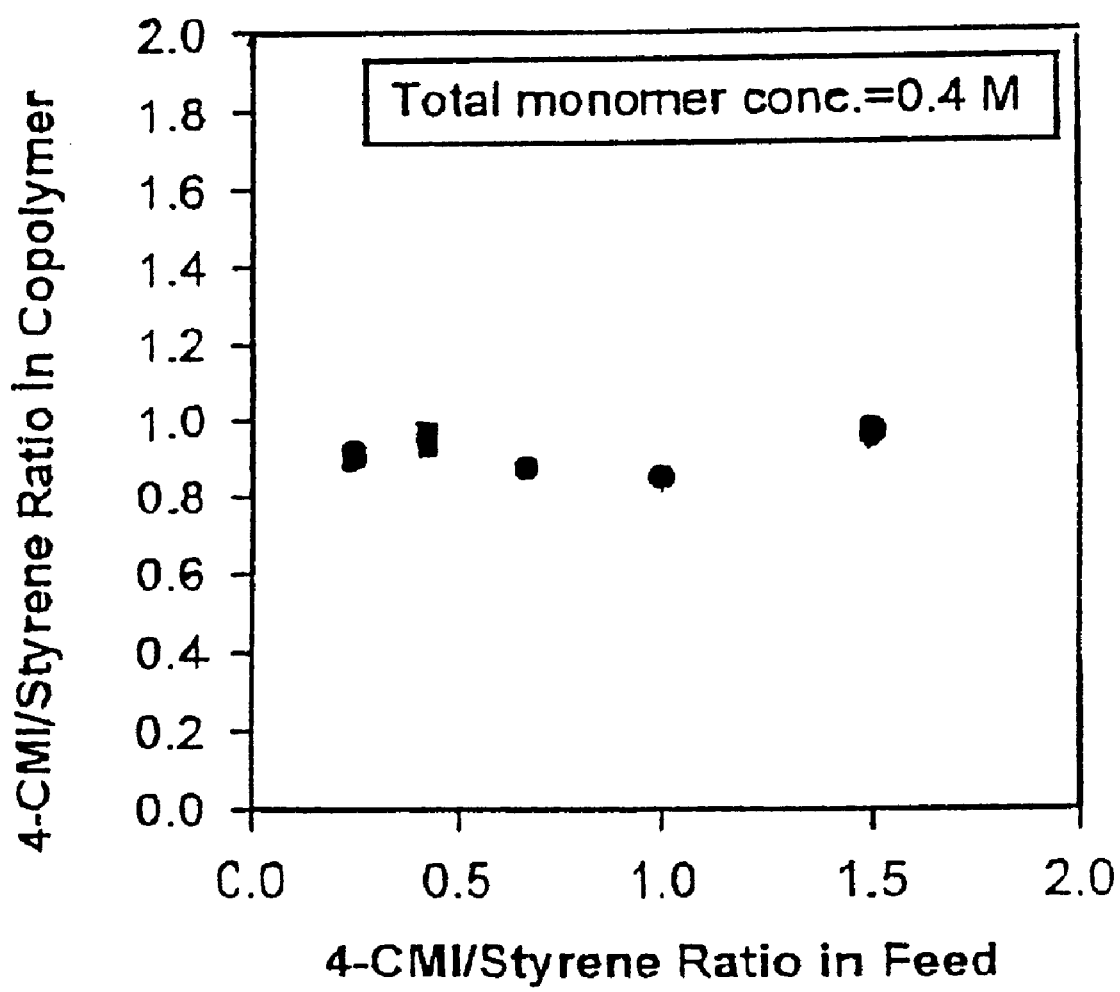
FIG. 4 is a plot showing the effect of varying the 4-CPMI to styrene feed ratio on the 4-CPMI to styrene ratio in a poly(4-CPMI/styrene) according to the present invention.

A calibration plot was then constructed using blends of these two homopolymers at various ratios. The absorption peaks at 1510 $cm^{-1}$ for styrene and at 1493 $cm^{-1}$ for 4-CPMI were chosen as the characteristic peaks for styrene and 4-CPMI, respectively. When the absorbance ratio of these two peaks is plotted vs. the molar ratio of poly(4-CPMI) to polystyrene present in the blend, as shown in FIG. 3, very good linearity is obtained. The polymerization was controlled in such a way as to proceed at low monomer conversion levels, in which case the monomer concentrations can be assumed to be constant during the reaction course. Using the above calibration, the ratio of 4-CPMI and styrene incorporated into the polymer obtained were then determined to be 1:1. As shown in FIG. 4, as the ratio of 4-CPMI to styrene in the feed changes, the ratio of 4-CPMI to styrene in the polymer coating remains essentially constant.

The molecular weight of the polymer formed was determined to be fairly high, with the weight average molecular weight, $M_W$, of 146,000 by GPC, and a polydispersity index, $M_W/M_N$, of 2.4. These results are typical for free radical polymerization, in that high molecular weight polymer can usually be obtained relatively easily.

Figure 5:
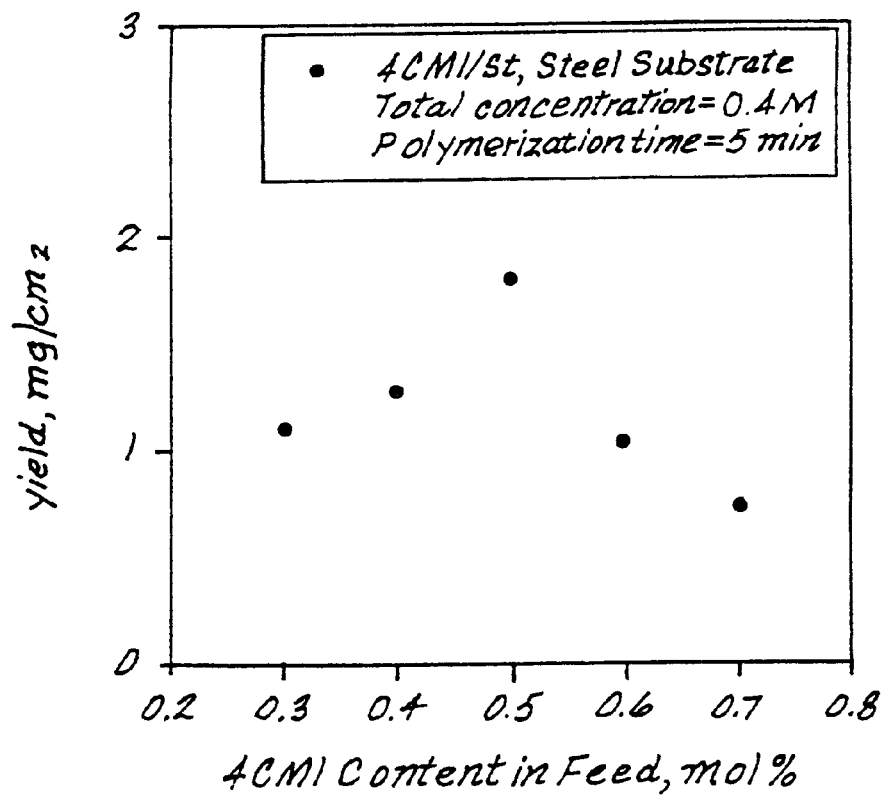
FIG. 5 is a plot showing the effect of varying the 4-CPMI content in the feed on the yield of poly(4-CPMI/styrene) according to the present invention.
Figure 6:
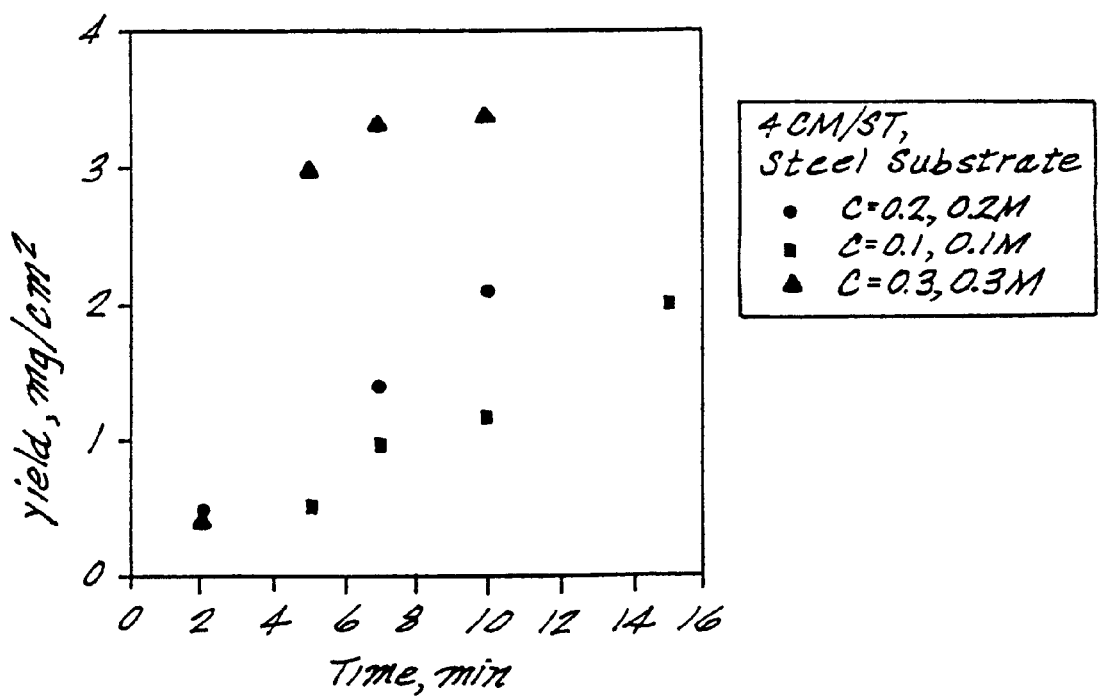
FIG. 6 is a plot showing the effect of varying concentrations on yield of poly(4-CPMI/styrene) according to the present invention.
Figure 7:
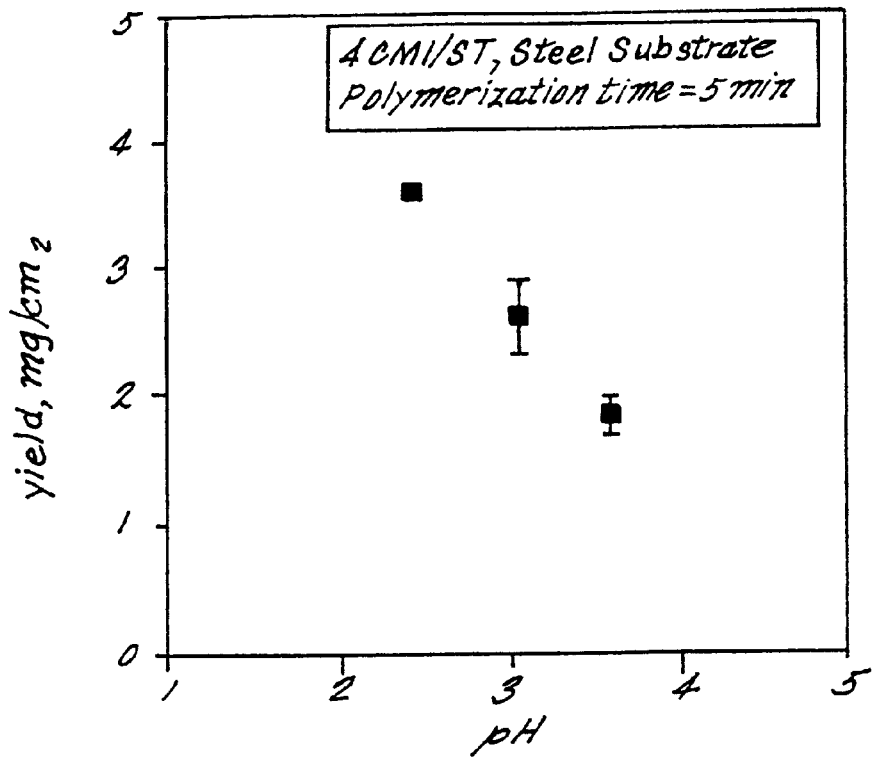
FIG. 7 is a plot showing the effect of varying the pH of the monomer solution on the yield of poly(4-CPMI/styrene) according to the present invention.

The effects of various process parameters on yield of poly(4-CPMI/styrene) are shown in FIGS. 5, 6, and 7. FIG. 5 is a plot of yield based on mole percent of 4-CPMI in the feed at a polymerization time of five minutes. As shown in FIG. 6, yield generally increases both with increased reaction time and increased molar concentration of both monomers. Yield decreases with increasing pH (FIG. 7).

Figure 8:
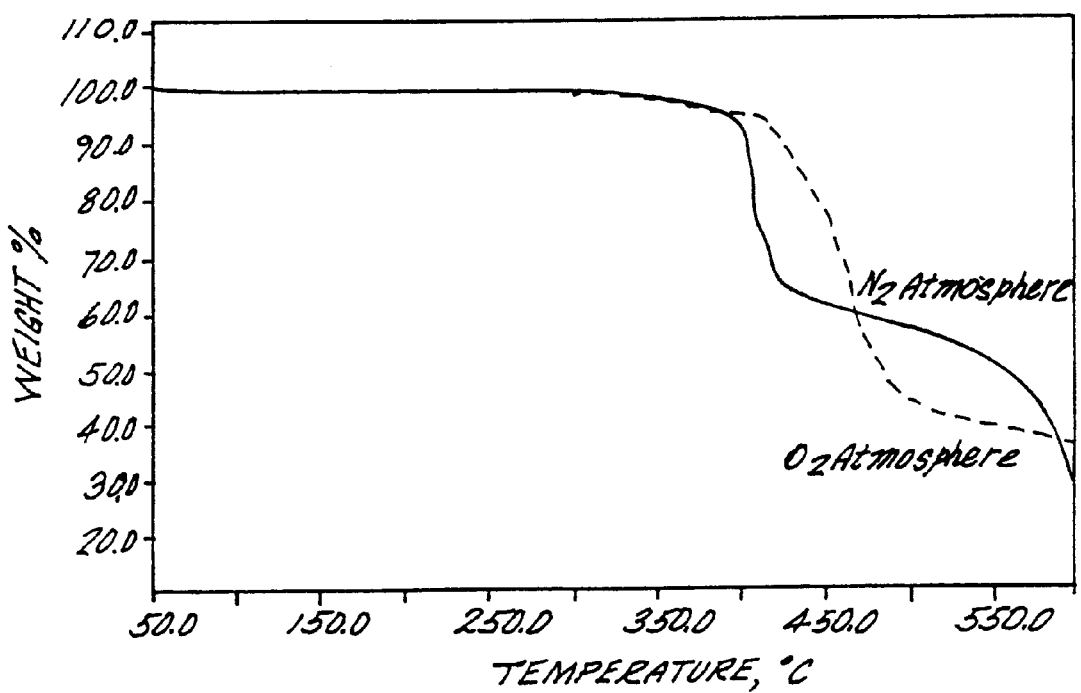
FIG. 8 is a TGA thermogram of a poly(4-CPMI/styrene) coating obtained on steel by the method according to the present invention as measured under (a) nitrogen atmosphere and (b) oxygen atmosphere.

The incorporation of the rigid five-membered ring of 4-CPMI into the polymer backbone significantly hindered segmental rotation and stiffened the chain, resulting in much improved thermal stability as compared with polystyrene homopolymer. As shown in the TGA thermogram in FIG. 8, when measured under nitrogen atmosphere, the copolymer is stable up to 450° C., after which it undergoes a one-stage decomposition. The thermal stability is still excellent in an oxygen atmosphere, where the onset temperature for degradation is only lowered by about 50° C., to 400° C. It is likely that the significant improvement in thermal properties of the poly(4-CPMI/styrene) obtained by the method of the present invention, as compared to polystyrene, is due to the large proportion of 4-CPMI incorporated into the polymer chain.

A low dielectric constant is very critical for insulation applications. Dielectric constant measurements on the coating at selected frequencies are listed in Table 1 below. The poly(4-CPMI/styrene) coating has a dielectric constant of about 2.6 in the frequency range investigated, comparable to or slightly lower than that of one of the widely used commercial polyimides. Thus the coating of the present invention will be an attractive candidate for insulation applications.

TABLE 1

Dielectric Constant of Poly(4-CPMI/styrene)

| Frequency (Hz) | Dielectric Constant |
| --- | --- |
| 1 | 2.68 |
| 10 | 2.65 |
| 60 | 2.64 |
| 100 | 2.64 |
| 600 | 2.63 |
| 1000 | 2.63 |
| 6000 | 2.60 |
| 10000 | 2.55 |

EXAMPLE 2

Poly(NPMI/styrene) on Aluminum

General Polymerization Procedure: NPMI and styrene were dissolved in NMP in an equimolar ratio to obtain the final concentrations shown in FIG. 9. Dilute aqueous sulfuric acid (0.025 M) was then added slowly to the solution while stirring, until a 57/43 volume ratio of NMP/water was obtained.

The monomer solution was then purged with nitrogen. Dissolved oxygen content was kept to less than 2 ppm. When the pretreated aluminum was immersed in the monomer bath, a white, swollen polymer coating began to form. Polymerization time for samples in the bath varied from 10 minutes to 120 minutes. The coated sample was then immersed in a gently stirred 10% NMP solution for 1 hour, to remove excess NMP, and was oven dried at 150° C. for 1 hour and then at 225 to 250° C. for 4–6 hours.

Results and Discussion: The solvent quantity of the 57/43 NMP/water solution is close to the solubility limit of the monomers. The polymer formed on the aluminum surface is insoluble in the solution but is in a swollen state. The swollen nature of the polymer coating permits the diffusion of monomers through the polymer to reach the aluminum surface and also to react with the propagating chain ends. Thus, coatings up to 50 μm thick can be obtained. Coating thickness can be controlled by varying the polymerization time, or the monomer concentration.

Figure 9:
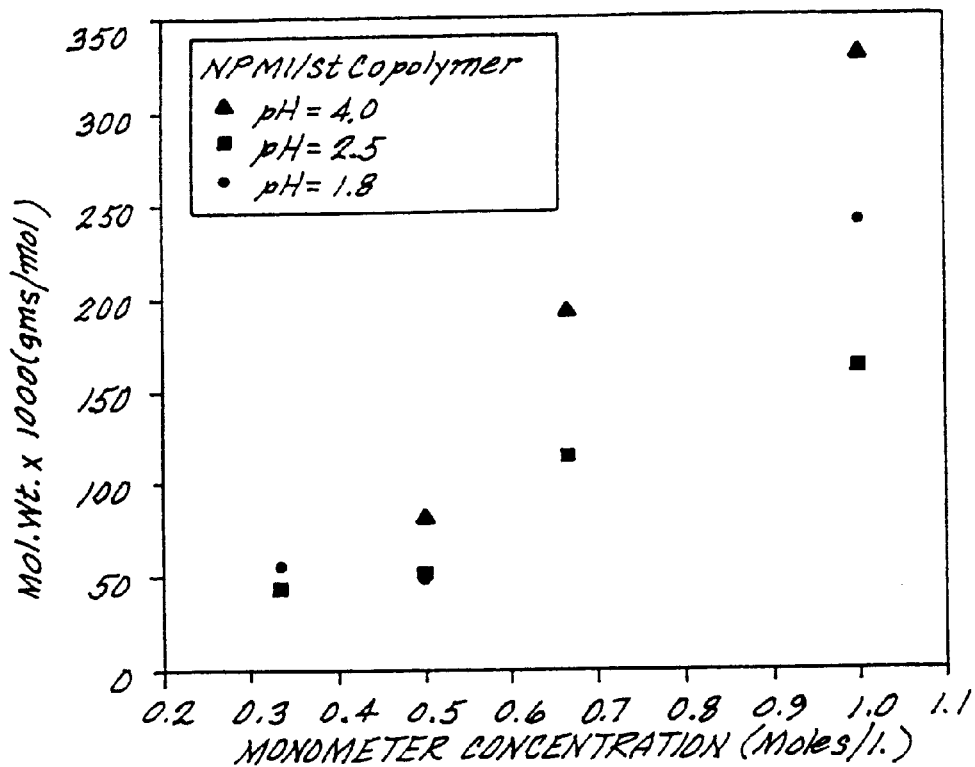
FIG. 9 is a plot showing the weight average molecular weight ($M_W$) of a poly(NPMI/styrene) coating formed by the method according to the present invention as a function of total monomer concentration for solutions of varying pH.

FIG. 9 shows the weight average molecular weight ($M_W$) of the coatings formed by autopolymerization plotted as a function of total monomer concentration for solutions of varying pH as determined by GPC measurement. At low pH it is expected that a greater number of Lewis acid sites should be generated at the aluminum metal surface, resulting in a high rate of initiation. This would give a relatively low molecular weight polymer, in keeping with classical free radical polymerization equations. As the pH increases, the number of Lewis acid sites formed should be less, and thus the molecular weight of the polymer obtained should be higher. It was further found that the polymerization reaction was quenched by the addition of 2,2-diphenyl-1-picrylhydrazyl hydrate (DPPH), confirming the free radical nature of the reaction of NPMI and styrene autopolymerization on aluminum.

Furthermore, use of higher monomer concentration yielded higher molecular weight polymers. At any given concentration, molecular weight increased with solution pH. Polydispersity index (PDI) ranged from 2.5 to 3.5 in all cases.

EXAMPLE 3

Poly(NPMI/MEA/styrene) on Aluminum

The polymer coatings of poly(NPMI/styrene) formed on aluminum exhibited a tendency to crack while drying when the coating thickness was greater than 10 microns. To solve this problem, another monomer was incorporated into the polymer. The MEA monomer is an electron acceptor due to presence of electron withdrawing carbonyl groups next to the C=C bond, similar to NPMI, and has been previously used in adhesives and anti-corrosion primer compositions.

Thus, MEA was introduced in the feed solution and the NPMI/MEA ratio was varied while maintaining a constant styrene concentration. In this way, an equimolar ratio of acceptor and donor monomers was maintained in the solution. Coatings of poly(NPMI/MEA/styrene) were synthesized according to the general procedure of Example 2, wherein NPMI and styrene were dissolved in NMP. Dilute aqueous sulfuric acid (0.025 M) was then added slowly to the solution while stirring, until a 57/43 volume ratio of NMP/water was obtained. MEA was then added dropwise, yielding a clear, yellow-colored solution of pH 3.3.

Inclusion of MEA in the polymer resulted in crack free coatings and a significant improvement in the adhesion of the swollen coating to the aluminum substrate. Corrosion resistance of the coated samples was also improved by addition of MEA (see FIG. 14).

Figure 10:
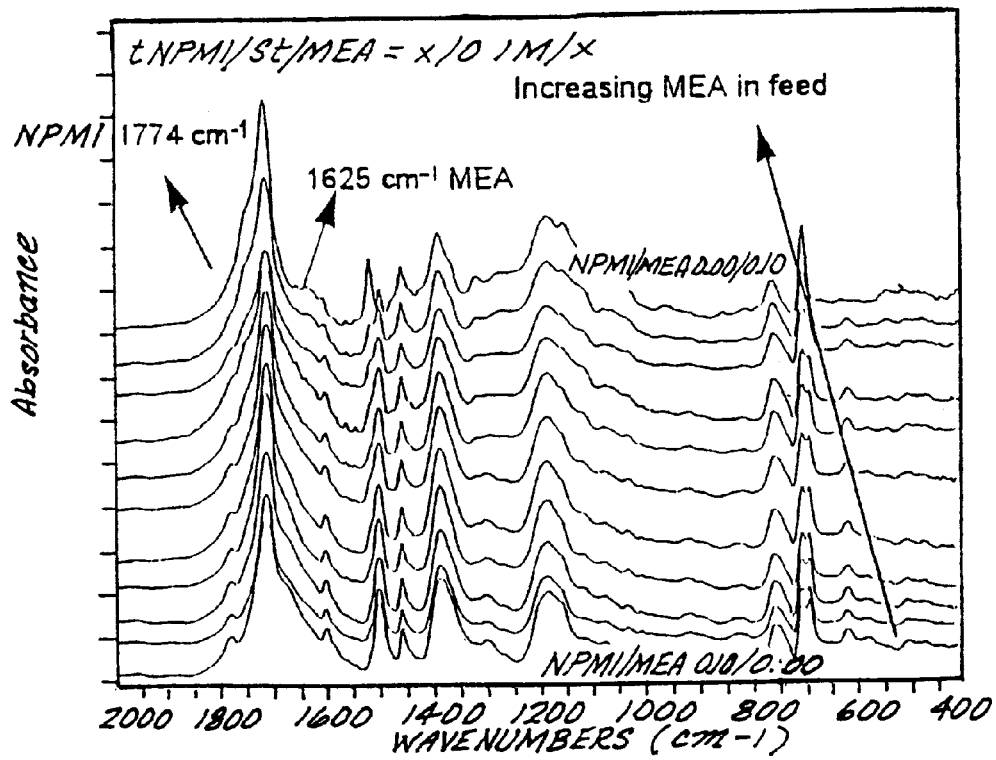
FIG. 10 is an FTIR overlaid spectrum showing formation of poly(NPMI/styrene/MEA) polymer in accordance with the present invention.

To detect the inclusion of MEA in the polymer coating, FTIR spectra were collected on a series of polymer coatings made by varying the NPMI/MEA ratio from 0.10M/0.00M to 0.00M/0.10M in increments of 0.01M. The total concentration of NPMI and MEA was kept at 0.10M. Styrene concentration was 0.10M. Spectra for the series are shown in FIG. 10. As the concentration of MEA in feed is increased, a carbonyl peak in the 1625–1635 $cm^{-1}$ region appears, and increases in intensity, relative to the 1774 $cm^{-1}$ imide peak from NPMI. The low wave number from the MEA peak is due to the hydrogen bonded enol form to the beta-diketone linkage. Also a general broadening of the carbonyl bands in the 1720 $cm^{-1}$ region occurs, due to the overlapping from MEA and NPMI. The 1598 $cm^{-1}$ peak is due to the phenyl ring from NPMI. It also decreases in intensity as MEA content relative to NPMI increases in the resulting polymer.

EXAMPLE 4

Poly(NPMI/MEA/BMI/styrene) on Aluminum

A series of poly(NPMI/MEA/BMI/styrene) coatings on aluminum were prepared by the method of Example 4, wherein the concentration of BMI was 0.0025 M. Similar FTIR results were obtained as those for Example 3. The addition of BMI to the comonomer solution also illustrates the versatility of the autopolymerization process, in that different monomers, or different monomer ratios may be used to adjust the properties of the final coating. After the metal substrate is coated with polymer, it is withdrawn from the bath, rinsed in another bath and then dried. During the drying process, water evaporates faster due to its lower boiling point (the boiling point of NMP is 210° C.), and the relative content of NMP in the polymer coating increases. Consequently, the swollen polymer coating is plasticized and some flow of the coating occurs before all of the solvent evaporates. This phenomenon occurs frequently when poly (NPMI/MEA/styrene) coatings are dried.

To arrest this flow, BMI was incorporated to cross-link the coating and increase the molecular weight of the coating.

Addition of 0.0025M BMI in the NMP/water monomer feed solution arrested the flow of the coatings during drying and gave coatings with uniform thickness.

Figure 11:
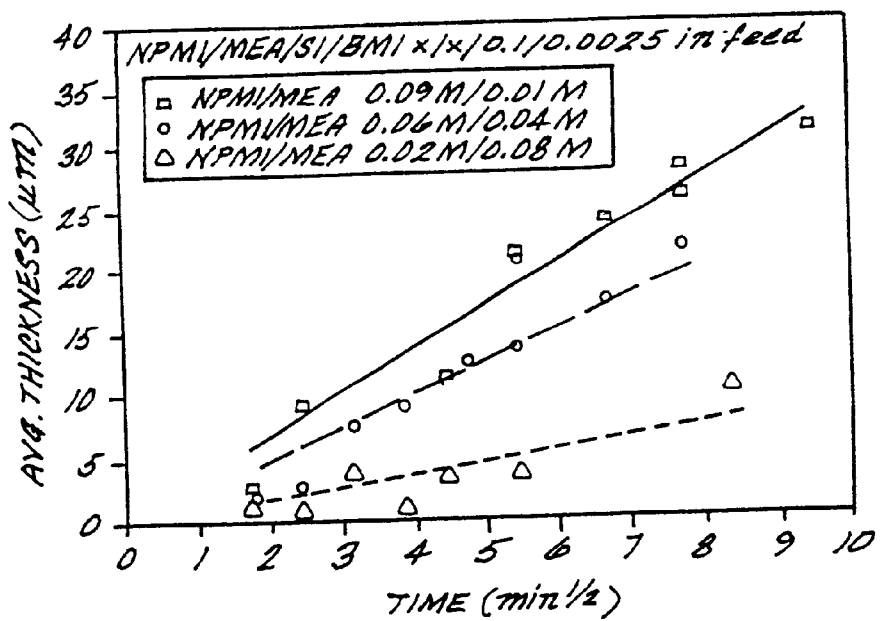
FIG. 11 is a plot showing the effect of polymerization time on the coating thickness for various monomer feed compositions in the practice of the present invention.

FIG. 11 shows a plot of coating thickness obtained as a function of polymerization time for various monomer compositions in feed. The ordinate axis is plotted as the square root of time, which results in linear fits of the measured coatings thickness. This indicates that such a polymerization process is limited by rate of diffusion of monomers to the propagating radicals. These observations are consistent with the equations obtained using a flat plate surface reaction model, where the rate limiting step is the process of diffusion of monomers in the swollen polymer coating being formed on the aluminum surface. According to this model, the thickness of the polymer coating is proportional to the square root of reaction time. As the ratio of MEA to NPMI in the feed was increased, the rate of polymerization decreased. This suggests a lower activity for MEA monomer compared to NPMI monomer. Sand-blasting and HF etching pretreatments gave similar kinetic results.

Figure 12:
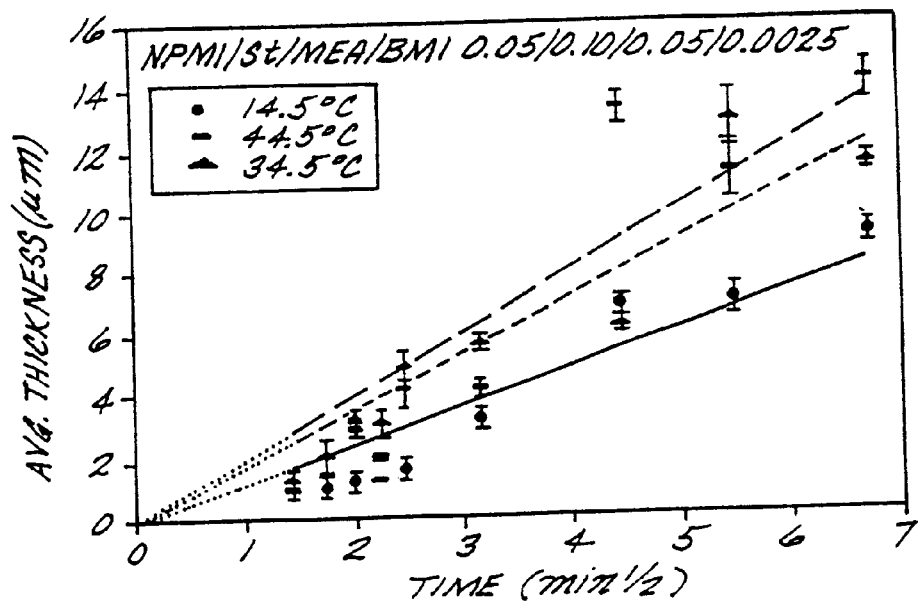
FIG. 12 is a plot showing the effect of polymerization temperature over time on the measured coating thickness of poly(NPMI/styrene/MEA/BMI) aluminum composite according to the present invention.

FIG. 12 shows the coating thickness obtained at different polymerization temperatures and times. The increase in the polymerization rate is due to the increase in diffusion coefficients of the monomers in the solution, consistent with the diffusion limited model. Regression fits show that the rate of polymerization increases with temperature. The effect, however, is not very dramatic. This also indicates that the polymerization process is limited by the monomer diffusion, rather than reaction rate limited.

EXAMPLE 5

Poly(4-CPMI/MMA) on Steel

Figure 13:
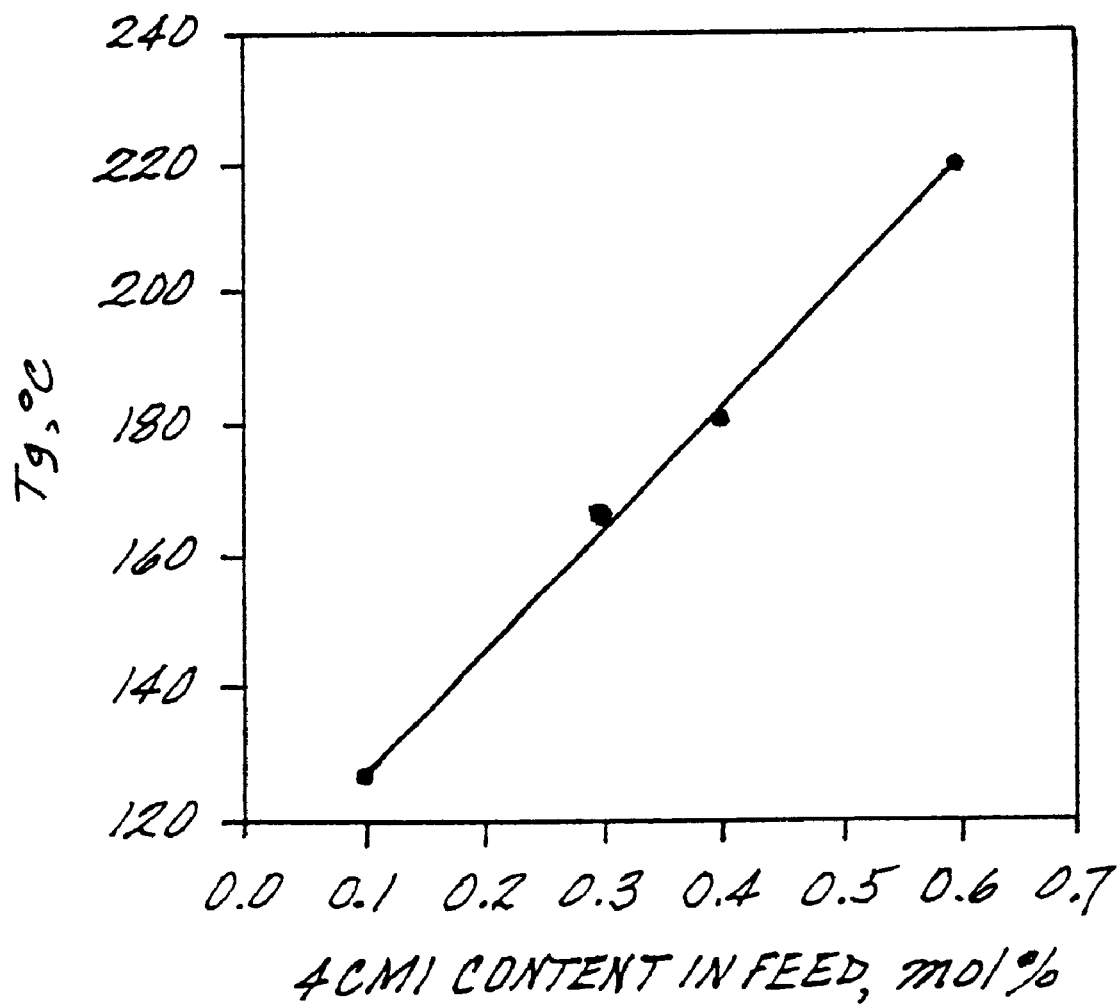
FIG. 13 is a plot showing the effect of varying 4-CPMI content in the feed on the glass transition temperatures of poly(4-CPMI/MMA) coatings in accordance with the present invention.

Coatings comprising poly(4-CPMI/MMA) on steel were obtained using the same general procedure of Example 1. Thus, 4-CPMI and MMA were dissolved in NMP on a 1:1 mole basis, then mixed with water to form a solution of 0.2 M in each monomer. Polymerization was initiated by dipping a cleaned substrate in the solution. Simultaneous polymerization of the monomers and deposition of the formed polymers occurred at the metal surface. As shown in FIG. 13, the change in composition of the coatings (as indicated by change in Tg) with change in 4-CPMI content of the feed indicates that a random, rather than an alternating copolymer is formed. Poly(4-CPMI/acrylonitrile) may also be formed on steel by this method.

EXAMPLE 6

Poly(NPMI/BMI/styrene) on Aluminum by Painting

A viscous paint solution was prepared by mixing 57 mL of N-methyl-2-pyrrolidone (NMP) as a solvent with sufficient NPMI, BMI, and styrene to make the solution 0.3M in N-phenyl maleimide, 0.3 M in styrene, and 0.075 M in bis-maleimide when the solution is mixed with 43 mL of deionized water as follows. The solution was placed in a cold water bath and 43 mL of deionized water containing enough $H_2SO_4$ to bring the solution pH to within a range of 2.5 to 3.5, was added with thorough mixing to make a solution that is 0.3M in N-phenyl maleimide, 0.3 M in styrene, and 0.075 M in bis-maleimide. Acidity may be adjusted by other acids, for example $H_3PO_4$. The selection of acid is dependent upon the choice of metal substrate to be coated. The solution was then purged by bubbling with nitrogen gas to remove most of the dissolved oxygen from the system. Polyvinylpyrrolidone (1.3 million molecular weight) was added after purging as a thickening agent at a concentration of about 12.5 to 25 wt. % based on the total weight of solution, to form a viscous paint solution. Just prior to application of the solution to the metal substrate, 3-(methoxysilyl)propyl methacrylate was added as an adhesion promoter.

An aluminum substrate was pretreated to remove the weak oxide layer in an aqueous bath containing 5% hydrofluoric acid, rinsed with deionized water, and wiped dry with a laboratory paper towel just prior to the application of the paint solution. Other standard metal treatments such as grit blasting or alkaline treatments may be used.

The viscous paint solution was poured onto the surface of the aluminum metal substrate, spread with a doctor blade, and allowed to stand at room temperature for several hours. A skin of polyvinylpyrrolidone was observed as the monomers migrated to the metal surface. Eventually an opaque layer was observed underneath the polyvinylpyrrolidone. This is due to the insoluble nature of the polymer.

After polymerization, the coated aluminum substrate was rinsed several times with a water-solvent rinse bath containing approximately 15–20% N-methyl-2-pyrrolidone solvent by volume based on the total volume of the water and N-methyl-2-pyrrolidone solvent rinse, to remove the poly (vinylpyrrolidone), excess monomer, etc., but not the formed coating.

Physical Properties

Figure 14A:
FIGS. 14(A)–(C) are photographs showing corrosion resistance of poly(NPMI/styrene/MEA) aluminum composites according to the present invention.
Figure 14B:
Figure 14C:

Thermal Properties: Glass transition temperatures were measured using differential scanning calorimetry (DSC). A single $T_g$ was observed for all poly(NPMI/styrene) polymers and all other compositions of poly(NPMMEA/styrene) and poly(NPMI/MEA/BMI/styrene). A separate $T_g$ of poly (MEA) (25° C.) was not observed. This indicates that MEA-styrene acceptor-donor monomers were included in the NPMI/styrene copolymer in random units. As shown in Table 2 below, the $T_g$ decreased only slightly with increasing MEA content in the polymer coatings, both in presence and absence of BMI. All transition temperatures were greater than 200° C. Glass transition temperatures of the coating also increased with addition of BMI in feed. This very significant outcome demonstrates that the autopolymerization process is suitable for making high temperature resistant coatings by polymerization at room temperature. Thermal stability of the coatings was found to be very good. As shown in FIG. 14, onset of degradation for poly(NPMI/styrene) on aluminum occurred at more than 350° C. under nitrogen atmosphere and was not affected by incorporation of MEA.

TABLE 2

Glass Transition Temperatures.

| Monomer Feed Composition NPMI/MEA/styrene (moles/lit) | $T_g$ (° C.) | Monomer Feed Composition NPMI/MEA/styrene/BMI (moles/lit) | $T_g$ (° C.) |
|---|---|---|---|
| 0.10/0.00/0.10 | 216.2 | 0.10/0.00/0.10/0.0025 | 219.8 |
| 0.08/0.02/0.10 | — | 0.08/0.02/0.10/0.0025 | 218.4 |
| 0.07/0.03/0.10 | 207.7 | 0.07/0.03/0.10/0.0025 | 215.8 |
| 0.06/0.04/0.10 | — | 0.06/0.04/0.10/0.0025 | 215.5 |
| 0.05/0.05/0.10 | 205.5 | 0.05/0.05/0.10/0.0025 | — |
| 0.04/0.06/0.10 | 197.2 | 0.04/0.06/0.10/0.0025 | 215.1 |
| 0.03/0.07/0.10 | 200.4 | 0.03/0.07/0.10/0.0025 | 210.3 |
| 0.02/0.08/0.10 | 200.6 | 0.02/0.08/0.10/0.0025 | — |
| 0.01/0.09/0.10 | 198.6 | 0.01/0.09/0.10/0.0025 | 201.8 |

Electrical Resistance: The coatings exhibited good resistance to DC potential. Samples coated with 20 μm thick polymer, spontaneously polymerized from a feed solution of NPMI/MEA/BMI/styrene ratio of 0.05/0.05/0.0025/0.10 M, did not show any significant current leakage up to an applied potential of 1800V.

Corrosion Studies: FIG. 11A shows an unexposed 6061 aluminum sample coated with 20 μm thick poly(NPMI/

MEA/styrene) polymer coating on the right half. FIG. 11B shows the sample after 1500 hours of exposure to salt fog as measured by ASTM B-117. The coated side is unaffected, while the uncoated side is corroded. No propagation of corrosion is seen occurring at the polymer-metal interface. No corrosion is seen around any of the edges of the sample, illustrating the uniformity of the polymer coating. Similar results are seen for the sample exposed for 3000 hours (FIG. 11C). This is an inherent property and advantage of the dip autopolymerization process. Since polymerization is initiated only at the surface, metal samples with complex surface topographies can be uniformly coated. Coating also forms inside holes and on edges.

In summary, the method of the present invention is easy, efficient and environmentally friendly. It requires minimal equipment, and has the advantage of being economical. Polymer coatings up to 50 microns in thickness may be formed, and very high molecular weights in the range of $M_w=250,000$ and over may be obtained. The coatings are of uniform thickness and conformal, with excellent adhesion to the substrate. Coatings are readily formed even on complex surfaces. Furthermore, the coatings may be readily formulated to provide properties such as high temperature resistance and stability, good electrical breakdown resistance, low dielectric constant, and abrasion and corrosion protection by appropriate monomer selection and ratio. Such coatings may be used in a variety of applications, ranging from coating of circuit board components to automotive components.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A process to produce a polymer-coated metal composite comprising:
   providing an acidic starting solution consisting essentially of at least two chemically distinct monomers, an acid and at least one solvent which dissolves or forms an emulsion of the at least two monomers, wherein the at least two monomers are polymerizable on the surface of a metal substrate and upon contact with the metal substrate in the absence of other catalyst or catalysts;
   applying the acidic starting solution to the metal substrate, wherein the metal substrate is a metal which will initiate polymerization of the at least two monomers on the surface of the metal substrate; and
   leaving the metal substrate in contact with the starting solution for a time effective to form a polymeric coating on the metal substrate, producing a polymer-coated metal composite.

2. The process of claim 1, wherein the acidic starting solution further utilizes a viscosity-modifying agent.

3. The process of claim 2, wherein
the viscosity-modifying agent is selected from the group consisting of poly(vinylpyrrolidone), poly(ethylene oxide), poly(acrylic acids) and derivatives thereof, ethylene-maleic anhydride copolymers, vegetable gums, guar gum, sodium alginate, gum tragacanth, cellulose-based compounds, cellulose, methyl cellulose, carboxymethyl cellulose, sodium carboxymethyl cellulose, and ethylene-vinyl ether copolymer.

4. The process of claim 3, wherein
the viscosity-modifying agent is polyvinylpyrrolidone.

5. The process of claim 1, wherein the acidic starting solution further utilizes an adhesion promoter.

6. The process of claim 5, wherein
the adhesion promoter is selected from the group consisting of silanes, vinyltrimethoxysilane, vinyltriethoxysilane, vinyltris(β-methoxyethoxy)silane, phenyl trimethoxy silane, phenyl triethoxysilane, γ-methacryloxypropyltrimethoxysilane, vinyltrichlorosilane, N-β-(N-vinylbenzylaminoethyl)-γ-aminopropyltrimethoxysilane, vinyltriacetoxysilane, γ-methacryloxypropylmethyldimethoxysilane, 3-(methoxysilyl)propyl methacrylate, titanates, neopentyl(diallyl)trineodecanoyl titanate, neopentyl (diallyl)oxytri(dioctyl)phosphate titanate, and zirconates, neopentyl(diallyl)oxytri(dioctyl) pyrophosphate zirconate, and neopentyl(diallyl)oxytri(N-ethylenediamine)ethyl zirconate.

7. The process of claim 6, wherein
the adhesion promoter is 3-(methoxysilyl)propyl methacrylate.

8. The process of claim 1, wherein
the applying is by spraying, painting, roll coating, rod coating, blade coating, wire bar coating, extrusion coating, air knife coating, curtain coating, slide coating, doctor coating, or gravure coating.

9. The process of claim 8, wherein
the applying is by painting or spraying.

10. The process of claim 1, further comprising:
treating the produced polymer-coated metal composite to remove the thickening agent from the produced polymer-coated metal composite.

11. The process of claim 10, wherein
treating is by drying or rinsing.

12. The process of claim 11, wherein
rinsing is with water or a water-solvent rinse.

13. The process of claim 12, wherein
a solvent in the water-solvent rinse is selected from the group consisting of N-methyl-2-pyrrolidone, tetrahydrofuran, acetone, benzene, toluene, chloroform, methylene chloride, hexane, acetonitrile, dimethyl formamide, dimethylacetamide, dimethyl sulfoxide, acetonitrile, dimethyl formamide, dimethylacetamide, diglyme, cyclohexyl-2-pyrrolidone, pyridine, dimethyl sulfoxide, dioxane, and N,N-dimethylformamide.

14. The process of claim 1, wherein
the pH of the acidic starting solution is less than about 6.5.

15. The process of claim 14, wherein
the pH of the acidic starting solution is between about 6.5 and about 1.

16. The process of claim 15, wherein
the pH of the acidic starting solution is between about 5.5 and about 2.5.

17. The process of claim 1, wherein
the pH of the acidic starting solution is adjusted by the addition of at least one acid selected from the group consisting of sulfuric acid, hydrochloric acid, dilute nitric acid, acetic acid, phosphoric acid, and citric acid.

18. The process of claim 1, wherein the at least one solvent is selected from the group consisting of
benzene, toluene, chloroform, methylene chloride, hexane, acetone, tetrahydrofuran, acetonitrile, dimethyl formamide, dimethylacetamide, N-methyl-2pyrrolidone, dimethyl sulfoxide, a hydrocarbon solvent, a halogenated solvent, an aromatic solvent, an oxygen donating solvent, and mixtures of the foregoing with water.

19. The process of claim 1, wherein the metal substrate is a metal selected from the group consisting of
aluminum, copper, iron, steel, zinc, transition metals, chromium, tin, indium, nickel, cobalt, titanium, and alloys thereof.

20. The process of claim 1, wherein the at least two monomers comprise
at least one monomer selected from the group consisting of 4-carboxyphenylmaleimide and styrene; and at least one additional monomer selected from the group consisting of N-phenyl maleimide, 2-(methyacryloyloxy) ethyl acetoacetate, bis-maleimide, methyl methacrylate, 4-carboxyphenyl maleimide and acrylonitrile.

21. The process of claim 20, wherein
at least one monomer is 4-carboxyphenyl maleimide, and at least one additional monomer is methylmetharylate or acrylonitrile; and further wherein
the metal substrate is steel.

22. The process of claim 1, wherein the at least two monomers comprise
at least one electron acceptor monomer having at least one electron withdrawing group; and
at least one electron donor monomer having at least one electron donating group.

23. The process of claim 22, wherein
the electron acceptor monomer is selected from the group consisting of acrylic acids, acrylamides, acrylonitriles, alkyl, cycloalkyl, aryl, and aralkyl acrylates, methacrylic acid, methacrylamide, methacrylonitrile, alkyl, cycloalky, aryl, and aralky methacrylates, vinyl ketones, isopropenyl ketones, acrolein, methacrolein, thiocarboxylic acids, thiocarboxamides, alkyl, cycloalkyl, aryl, and aralkyl thiocarboxylates, dithioacrylic acids, dithiomethacrylic acids, N-substituted maleimides, maleic anhydride, and alkyl, cycloalkyl, aryl, and aralkyl esters of dithiocarboxylic acids.

24. The process of claim 23, wherein
the electron acceptor monomer is 4-carboxyphenyl maleimide, N-phenyl maleimide, bis-maleimide, 2-(methacryloyloxy)ethyl acetoacetate, or acrylonitrile.

25. The process of claim 22, wherein
the electron donor monomer is selected from the group consisting of 1-alkenes, alkyl, cycloalkyl, aryl, or aralkyl-substituted 1-alkenes, internal olefins, alkyl, cycloalkyl, aryl, or aralkyl-substituted internal olefins, conjugated dienes, and alkyl, cycloalkyl, aryl, and aralkyl-substituted conjugated dienes.

26. The process of claim 25, wherein
the electron donor monomer is alpha methyl styrene or styrene.

27. The process of claim 26, wherein
the electron donor monomer is styrene;
the electron acceptor monomer is 4-carboxyphenyl maleimide, N-phenyl maleimide, bis-maleimide, 2-(methacryloyloxy)ethyl acetoacetate, or acrylonitrile; and the metal substrate is aluminum, copper, iron, or zinc.

28. A process to produce a polymer-coated metal composite comprising:
providing an acidic starting solution consisting essentially of at least two chemically distinct monomers, a viscosity-modifying agent, an adhesion promoter, an acid and at least one solvent which dissolves or forms an emulsion of the at least two monomers, wherein at least one monomer is selected from the group consisting of 4-carboxyphenyl maleimide and styrene, and at least one additional mononomer is selected from the group consisting of N-phenyl maleimide, 2-(methacryloyloxy)ethyl acetoacetate, bis-maleimide, methyl methacrylate, 4-carboxyphenyl maleimide, and acrylonitrile, and further wherein the at least two chemically distinct monomers are polymerizable on a metal substrate upon contact with the metal substrate in the absence of other catalyst or catalysts;
applying the starting solution to the metal substrate; and
leaving the metal substrate in contact with the starting solution for a time effective to form a polymeric coating on the metal substrate, producing a polymer-coated metal composite.

29. The process of claim 28, wherein
the pH of the starting solution is less than about 6.5.

30. The process of claim 28, wherein
the metal substrate is a metal selected from the group consisting of aluminum, copper, iron, steel, zinc, transition metals, chromium, tin, indium, nickel, cobalt, titanium, and alloys thereof.

31. The process of claim 28, wherein
the adhesion promoter is selected from the group consisting of silanes, vinyltrimethoxysilane, vinyltriethoxysilane, vinyltris(β-methoxyethoxy) silane, phenyl trimethoxy silane, phenyl triethoxysilane, γ-methacryloxypropyltrimethoxysilane, vinyltrichlorosilane, N-β-(N-vinylbenzylaminoethyl)-γ-aminopropyltrimethoxysilane, vinyltriacetoxysilane, γ-methacryloxypropyhnethyldimethoxysilane, 3-(methoxysilyl)propyl methacrylate, titanates, neopentyl(diallyl)trineodecanoyl titanate, neopentyl (diallyl)oxytri(dioctyl)phosphate titanate, and zirconates, neopentyl(diallyl)oxytri(dioctyl) pyrophosphate zirconate, and neopentyl(diallyl)oxytri(N-ethylenediamine)ethyl zirconate.

32. The process of claim 28, wherein
the viscosity-modifying agent is selected from the group consisting of poly(vinylpyrrolidone), poly(ethylene oxide), poly(acrylic acids) and derivatives thereof, ethylene-maleic anhydride copolymers, vegetable gums, guar gum, sodium alginate, gum tragacanth, cellulose-based compounds, cellulose, methyl cellulose, carboxymethyl cellulose, sodium carboxymethyl cellulose, and ethylene-vinyl ether copolymer.

33. The process of claim 28, further produced by
treating to remove the viscosity-modifying agent.

34. The process of claim 33, wherein
treating is by drying or rinsing.

35. The process of claim 34, wherein
rinsing is with water or a water-solvent rinse.

36. A process to produce a polymer-coated metal composite comprising:
providing an acidic starting solution consisting essentially of at least one electron acceptor monomer having at least one electron withdrawing group, at least one electron donor monomer having at least one electron donating group, an acid and at least one solvent which dissolves or forms an emulsion of the at least two monomers, wherein the at least one electron acceptor monomer and the at least one electron donor monomer are polymerizable on the surface of a metal substrate upon contact with the metal substrate in the absence of other catalyst or catalysts;

applying the acidic starting solution to the metal substrate, wherein the metal substrate is a metal which will initiate polymerization of the at least two mononomers on the surface of the metal substrate; and leaving the metal substrate in contact with the starting solution for a time effective to form a polymeric coating on the metal substrate and upon contact with the metal substrate, producing a polymer-coated metal composite.

37. The process of claim 36, wherein the acidic starting solution further utilizes a viscosity-modifying agent.

38. The process of claim 37, wherein the viscosity-modifying agent is selected from the group consisting of poly(vinylpyrrolidone), poly(ethylene oxide), poly(acrylic acids) and derivatives thereof, ethylene-maleic anhydride copolymers, vegetable gums, guar gum, sodium alginate, gum tragacanth, cellulose-based compounds, cellulose, methyl cellulose, carboxymethyl cellulose, sodium carboxymethyl cellulose, and ethylene-vinyl ether copolymer.

39. The process of claim 37, wherein the viscosity-modifying agent is poly(vinylpyrrolidone).

40. The process of claim 36, wherein the acidic starting solution further utilizes an adhesion promoter.

41. The process of claim 40, wherein the adhesion promoter is selected from the group consisting of silanes, vinyltrimethoxysilane, vinyltriethoxysilane, vinyltris(β-methoxyethoxy) silane, phenyl trimethoxy silane, phenyl triethoxysilane, γ-methacryloxypropyltrimethoxysilane, vinyltrichlorosilane, N-β-(N-vinylbenzylaminoethyl)-γ-aminopropyltrimethoxysilane, vinyltriacetoxysilane, γ-methacryloxypropylmethyldimethoxysilane, 3-(methoxysilyl)propyl methacrylate, titanates, neopentyl(diallyl)trineodecanoyl titanate, neopentyl (diallyl)oxytri(dioctyl)phosphate titanate, and zirconates, neopentyl(diallyl)oxytri(dioctyl) pyrophosphate zirconate, and neopentyl(diallyl)oxytri(N-ethylenediamine)ethyl zirconate.

42. The process of claim 41, wherein the adhesion promoter is 3-(methoxysilyl)propyl methacrylate.

43. The process of claim 36, wherein the applying is by spraying, painting, roll coating, rod coating, blade coating, wire bar coating, extrusion coating, air knife coating, curtain coating, slide coating, doctor coating, or gravure coating.

44. The process of claim 36, wherein the applying is by painting or spraying.

45. The process of claim 36, further comprising:

treating the produced polymer-coated metal composite to remove the viscosity-modifying agent from the produced polymer-coated metal composite.

46. The process of claim 45, wherein treating is by drying or rinsing.

47. The process of claim 46, wherein rinsing is with water or a water-solvent rinse.

48. The process of claim 47, wherein the solvent in the water-solvent rinse is selected from the group consisting of N-methyl-2-pyrrolidone, tetrahydrofuran, acetone, benzene, toluene, chloroform, methylene chloride, hexane, acetonitrile, dimethyl formamide, dimethylacetamide, dimethyl sulfoxide, acetonitrile, dimethyl formamide, dimethylacetamide, diglyme, cyclohexyl-2-pyrrolidone, pyridine, dimethyl sulfoxide, dioxane, and N,N-dimethylformamide.

49. The process of claim 36, wherein the pH of the acidic starting solution is less than about 6.5.

50. The process of claim 36, wherein the metal substrate is a metal selected from the group consisting of aluminum, copper, iron, steel, zinc, transition metals, chromium, tin, indium, nickel, cobalt, titanium, and alloys thereof.

51. The process of claim 50, wherein the metal substrate is aluminum, copper, iron, zinc, or steel.

52. The process of claim 36, wherein the electron acceptor monomer is selected from the group consisting of acrylic acids, acrylamides, acrylonitriles, alkyl, cycloalkyl, aryl, and aralkyl acrylates, methacrylic acid, methacrylamide, methacrylonitrile, alkyl, cycloalkyl, aryl, and aralkyl methacrylates, vinyl ketones, isopropenyl ketones, acrolein, methacrolein, thiocarboxylic acids, thiocarboxamides, alkyl, cycloalkyl, aryl, and aralkyl thiocarboxylates, dithioacrylic acids, dithiomethacrylic acids, and alkyl, cycloalkyl, aryl, and aralkyl esters of dithiocarboxylic acids.

53. The process of claim 52, wherein the electron acceptor monomer is 4-carboxyphenyl maleimide, N-phenyl maleimide, bis-maleimide, 2-(methacryloyloxy)ethyl acetoacetate, or acrylonitrile.

54. The process of claim 36, wherein the electron donor monomer is selected from the group consisting of 1-alkenes, alkyl, cycloalkyl, aryl, or aralkyl-substituted 1-alkenes, internal olefins, alkyl, cycloalkyl, aryl, or aralkyl-substituted internal olefins, styrene, conjugated dienes, and alkyl, cycloalkyl, aryl, and aralkyl-substituted conjugated dienes.

55. The process of claim 54, wherein the electron donor monomer is styrene.

56. The process of claim 36, wherein the electron donor monomer is styrene;

the electron acceptor monomer is 4-carboxyphenyl maleimide, N-phenyl maleimide, bis-maleimide, 2-(methacryloyloxy)ethyl acetoacetate, or acrylonitrile; and the metal substrate is aluminum, copper, iron, zinc, or steel.

57. A process to produce a polymer-coated metal composite comprising:

providing an acidic starting solution consisting essentially of at least one electron acceptor monomer selected from the group consisting of acrylic acids, acrylamides, acrylonitriles, alkyl, cycloakl, aryl, and aralkyl acrylates, methacrylic acid, methacrylamide, methacrylonitrile, alkyl, cycloalkyl, aryl, and aralkyl methacrylates, vinyl ketones, isopropenyl ketones, acrolein, methacrolein, thiocarboxylic acids, thiocarboxamides, alkyl, cycloalkyl, aryl, and aralkyl thiocarboxylates, dithioacrylic acids, dithiomethacrylic acids, and alkyl, cycloalkyl, aryl, and aralkyl esters of dithiocarboxylic acids;

at least one electron donor monomer selected from the group consisting of 1-alkenes, alkyl, cycloalkyl, aryl, or aralkyl-substituted 1-alkenes, internal olefins, alkyl cycloalkyl, aryl, or aralkyl-substituted internal olefins, styrene, conjugated dienes, and alkyl, cycloalkyl, aryl, and aralkyl-substituted conjugated dienes;

at least one solvent which dissolves or forms an emulsion of the at least two monomers, wherein the at least one electron acceptor monomer and the at least one electron donor monomer are polymerizable on the surface of a metal substrate upon contact with the metal substrate in the absence of other catalyst or catalysts;

an acid;

a viscosity-modifying agent; and an adhesion promoter;

applying the starting solution to the metal substrate, wherein the metal substrate is a metal which will initiate polymerization of the at least two monomers on the surface of the metal substrate; and leaving the metal substrate in contact with the starting solution for a time effective to form a polymeric coating on the metal substrate, producing a polymer-coated metal composite.

58. The process of claim 57, wherein the pH of the starting solution is less than about 6.5.

59. The process of claim 57, wherein the metal substrate is a metal selected from the group consisting of aluminum, copper, iron, steel, zinc, transition metals, chromium, tin, indium, nickel, cobalt, titanium, and alloys thereof.

60. The process of claim 59, wherein the metal substrate is aluminum, copper, iron, zinc, or steel.

61. The process of claim 57, wherein the electron acceptor monomer is 4-carboxyphenyl maleimide, N-phenyl maleimide, bis-maleimide, 2-(methacryloyloxy)ethyl acetoacetate, or acrylonitrile.

62. The process of claim 57, wherein the electron donor monomer is styrene.

63. The process of claim 57, wherein the at least one electron donor monomer is styrene;

the at least one electron acceptor monomer is 4-carboxyphenyl maleimide, N-phenyl maleimide, bis-maleimide, 2-(methacryloyloxy)ethyl acetoacetate, or acrylonitrile; and the metal substrate is aluminum, copper, iron, zinc, or steel.

64. The process of claim 57, wherein the viscosity-modifying agent is selected from the group consisting of poly(vinylpyrrolidone), poly(ethylene oxide), poly(acrylic acids) and derivatives thereof, ethylene-maleic anhydride copolymers, vegetable gums, guar gum, sodium alginate, gum tragacanth, cellulose-based compounds, cellulose, methyl cellulose, carboxymethyl cellulose, sodium carboxymethyl cellulose, and ethylene-vinyl ether copolymer.

65. The process of claim 57, wherein the adhesion promoter is selected from the group consisting of silanes, vinyltrimethoxysilane, vinyltriethoxysilane, vinyltris(β-methoxyethoxy) silane, phenyl trimethoxy silane, phenyl triethoxysilane, γ-methacryloxypropyltrimethoxysilane, vinyltrichlorosilane, N-β-(N-vinylbenzylaminoethyl)-γ-aminopropyltrimethoxysilane, vinyltriacetoxysilane, γ-methacryloxypropylmethyldimethoxysilane, 3-(methoxysilyl)propyl methacrylate, titanates, neopentyl(diallyl)trineodecanoyl titanate, neopentyl (diallyl)oxytri(dioctyl)phosphate titanate, and zirconates, neopentyl(diallyl)oxytri(dioctyl) pyrophosphate zirconate, and neopentyl(diallyl)oxytri(N-ethylenediamine)ethyl zirconate.

66. A process to produce a polymer-coated metal composite comprising:

providing an acidic starting solution consisting essentially of one monomer, an acid and at least one solvent which dissolves or forms an emulsion of the monomer, wherein the monomer is polymerizable on the surface of a metal substrate and upon contact with the metal substrate in the absence of other catalyst or catalysts;

applying the acidic starting solution to the metal substrate, wherein the metal substrate is a metal which will initiate polymerization of the monomer on the surface of the metal substrate; and leaving the metal substrate in contact with the starting solution for a time effective to form a polymeric coating on the metal substrate, producing a polymer-coated metal composite.

67. The process of claim 66, wherein the monomer is N-phenylmaleimide.

68. The process of claim 66, wherein the acidic starting solution further utilizes a viscosity-modifying agent.

69. The process of claim 68, wherein the viscosity-modifying agent is selected from the group consisting of poly(vinylpyrrolidone), poly(ethylene oxide), poly(acrylic acids) and derivatives thereof, ethylene-maleic anhydride copolymers, vegetable gums, guar gum, sodium alginate, gum tragacanth, cellulose-based compounds, cellulose, methyl cellulose, carboxymethyl cellulose, sodium carboxymethyl cellulose, and ethylene-vinyl ether copolymer.

70. The process of claim 69, wherein the viscosity-modifying agent is poly(vinylpyrrolidone).

71. The process of claim 66, wherein the acidic starting solution further utilizes an adhesion promoter.

72. The process of claim 71, wherein the adhesion promoter is selected from the group consisting of silanes, vinyltrimethoxysilane, vinyltriethoxysilane, vinyltris(β-methoxyethoxy) silane, phenyl trimethoxy silane, phenyl triethoxysilane, γ-methacryloxypropyltrimethoxysilane, vinyltrichlorosilane, N-β-(N-vinylbenzylaminoethyl)-γ-aminopropyltrimethoxysilane, vinyltriacetoxysilane, γ-methacryloxypropylmethyldimethoxysilane, 3-(methoxysilyl)propyl methacrylate, titanates, neopentyl(diallyl)trineodecanoyl titanate, neopentyl (diallyl)oxytri(dioctyl)phosphate titanate, and zirconates, neopentyl(diallyl)oxytri(dioctyl) pyrophosphate zirconate, and neopentyl(diallyl)oxytri(N-ethylenediamine)ethyl zirconate.

73. The process of claim 72, wherein the adhesion promoter is 3-(methoxysilyl)propyl methacrylate.

74. The process of claim 66, wherein the applying is by spraying, painting, roll coating, rod coating, blade coating, wire bar coating, extrusion coating, air knife coating, curtain coating, slide coating, doctor coating, or gravure coating.

75. The process of claim 74, wherein the applying is by painting or spraying.

76. A process to produce a polymer-coated metal composite comprising:

providing an acidic starting solution consisting essentially of at least two chemically distinct monomers and at least one solvent which dissolves or forms an emulsion of the at least two monomers, wherein the at least two monomers are polymerizable on the surface of a metal substrate and upon contact with the metal substrate in the absence of other catalyst or catalysts;

applying the acidic starting solution to the metal substrate, wherein the metal substrate is a metal which will initiate polymerization of the at least two monomers on the surface of the metal substrate; and leaving the metal substrate in contact with the staring solution for a time effective to form a polymeric coating on the metal substrate, producing a polymer-coated metal composite.

* * * * *